United States Patent
Dong et al.

(10) Patent No.: US 9,318,206 B2
(45) Date of Patent: Apr. 19, 2016

(54) SELECTIVE WORD LINE ERASE IN 3D NON-VOLATILE MEMORY

(71) Applicant: SanDisk Technologies Inc., Plano, TX (US)

(72) Inventors: Yingda Dong, San Jose, CA (US); Alex Mak, Los Altos Hills, CA (US); Seungpil Lee, San Ramon, CA (US); Johann Alsmeier, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/536,923

(22) Filed: Nov. 10, 2014

(65) Prior Publication Data

US 2015/0063033 A1    Mar. 5, 2015

Related U.S. Application Data

(62) Division of application No. 13/287,343, filed on Nov. 2, 2011, now Pat. No. 8,897,070.

(51) Int. Cl.
| | |
|---|---|
| *G11C 16/14* | (2006.01) |
| *G11C 16/04* | (2006.01) |
| *G11C 16/16* | (2006.01) |
| *H01L 29/792* | (2006.01) |
| *H01L 27/115* | (2006.01) |

(52) U.S. Cl.
CPC ............ *G11C 16/14* (2013.01); *G11C 16/0483* (2013.01); *G11C 16/16* (2013.01); *H01L 27/11582* (2013.01); *H01L 29/7926* (2013.01)

(58) Field of Classification Search
CPC ..... G11C 16/0483; G11C 16/14; G11C 16/16
See application file for complete search history.

(56) References Cited

U.S. PATENT DOCUMENTS

| | | | |
|---|---|---|---|
| 5,966,332 A | 10/1999 | Takano | |
| 6,987,696 B1 | 1/2006 | Wang et al. | |
| 7,881,114 B2 | 2/2011 | Park et al. | |
| 7,924,622 B2 | 4/2011 | Lee et al. | |
| 2002/0057600 A1* | 5/2002 | Sakui | 365/185.27 |
| 2008/0007999 A1* | 1/2008 | Park et al. | 365/185.02 |
| 2010/0002515 A1* | 1/2010 | Lutze | G11C 11/5635 365/185.17 |
| 2010/0067299 A1* | 3/2010 | Futatsuyama | G11C 11/5642 365/185.17 |

(Continued)

OTHER PUBLICATIONS

Restriction Requirement dated Dec. 9, 2013, U.S. Appl. No. 13/287,343, filed Nov. 2, 2011.

(Continued)

*Primary Examiner* — Khamdan Alrobaie
(74) *Attorney, Agent, or Firm* — Vierra Magen Marcus LLP

(57) ABSTRACT

An erase process for a 3D stacked memory device allows a portion of a block of memory cells to be erased. In one approach, in a U-shaped NAND string configuration, memory cells in the drain- or source-side columns are erased. In another approach, such as in a U-shaped or a straight NAND string configuration, memory cells in a portion of a column of memory cells are erased, and a dummy memory cell is provided between the erased and non-erased memory cells. A dummy memory cell can be on either side (e.g., above and below) of an erase memory cell, or on either side of a non-erased memory cell. A dummy memory cell is ineligible to store user data, but prevents a downshift in the threshold voltage of an erased memory cell from changing the threshold voltage of a non-erased memory cell, due to capacitive coupling.

20 Claims, 31 Drawing Sheets

(56) References Cited

U.S. PATENT DOCUMENTS

| | | | |
|---|---|---|---|
| 2010/0213537 A1* | 8/2010 | Fukuzumi | H01L 27/11578 257/326 |
| 2011/0051527 A1 | 3/2011 | Kirisawa et al. | |
| 2011/0063914 A1 | 3/2011 | Mikajiri et al. | |
| 2011/0157989 A1 | 6/2011 | Iwata | |
| 2011/0199825 A1 | 8/2011 | Han et al. | |
| 2012/0206961 A1* | 8/2012 | Kito | 365/185.2 |
| 2013/0107628 A1 | 5/2013 | Dong et al. | |
| 2015/0228352 A1* | 8/2015 | Choi | G11C 16/0483 365/185.2 |

OTHER PUBLICATIONS

Response to Restriction Requirement dated Dec. 20, 2013, U.S. Appl. No. 13/287,343, filed Nov. 2, 2011.

Non-final Office Action dated Feb. 12, 2014, U.S. Appl. No. 13/287,343, filed Nov. 2, 2011.

Response to Non-final Office Action dated May 9, 2014, U.S. Appl. No. 13/287,343, filed Nov. 2, 2011.

Notice of Allowance dated Aug. 27, 2014, U.S. Appl. No. 13/287,343, filed Nov. 2, 2011.

* cited by examiner

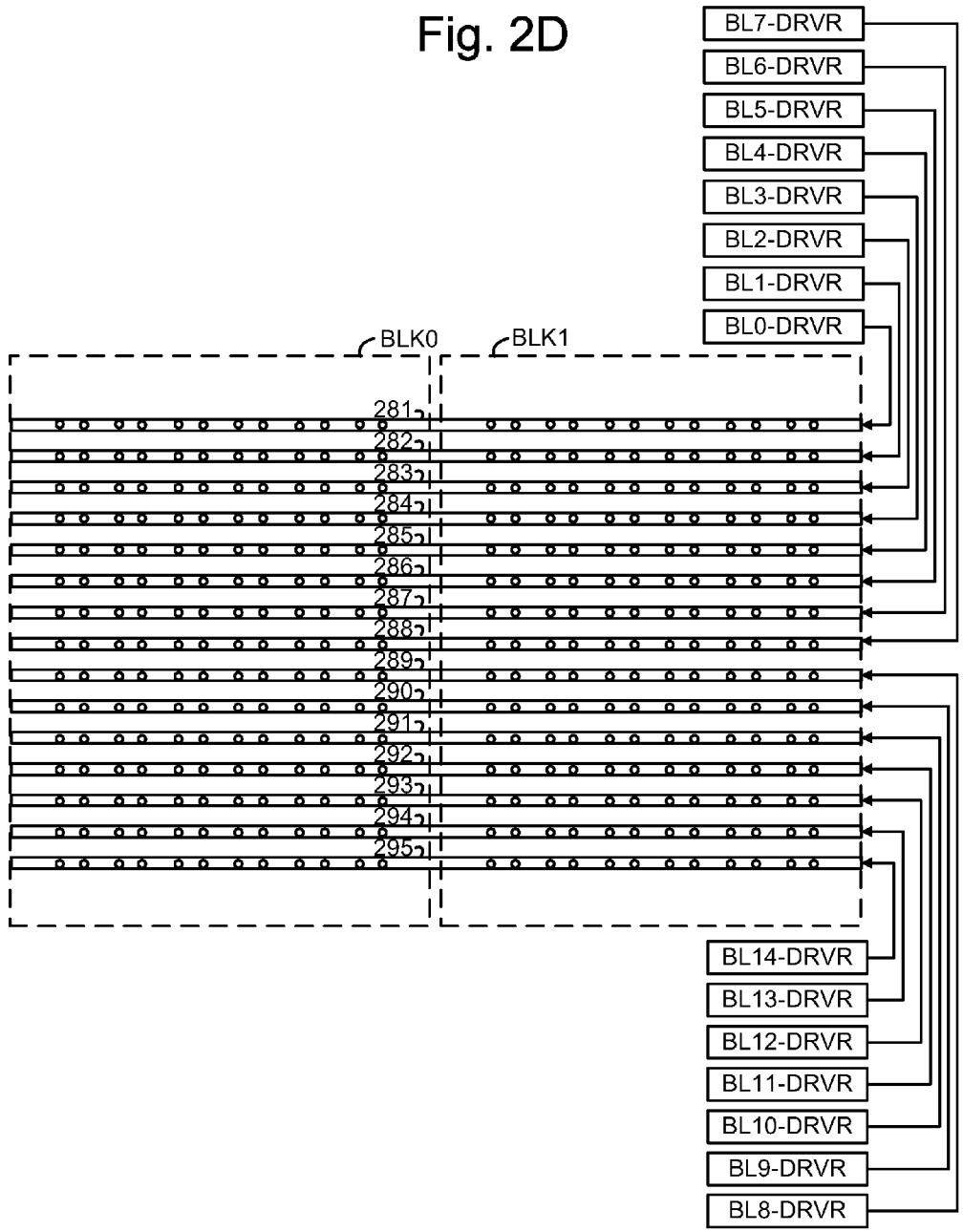

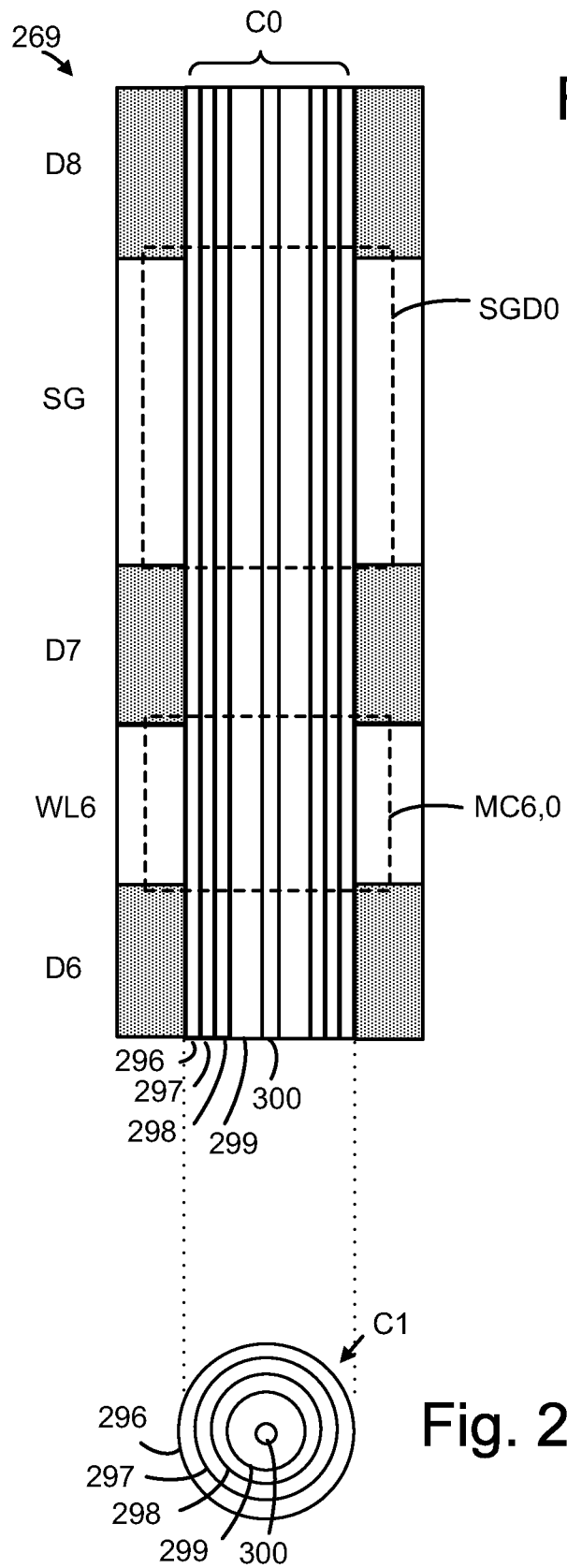

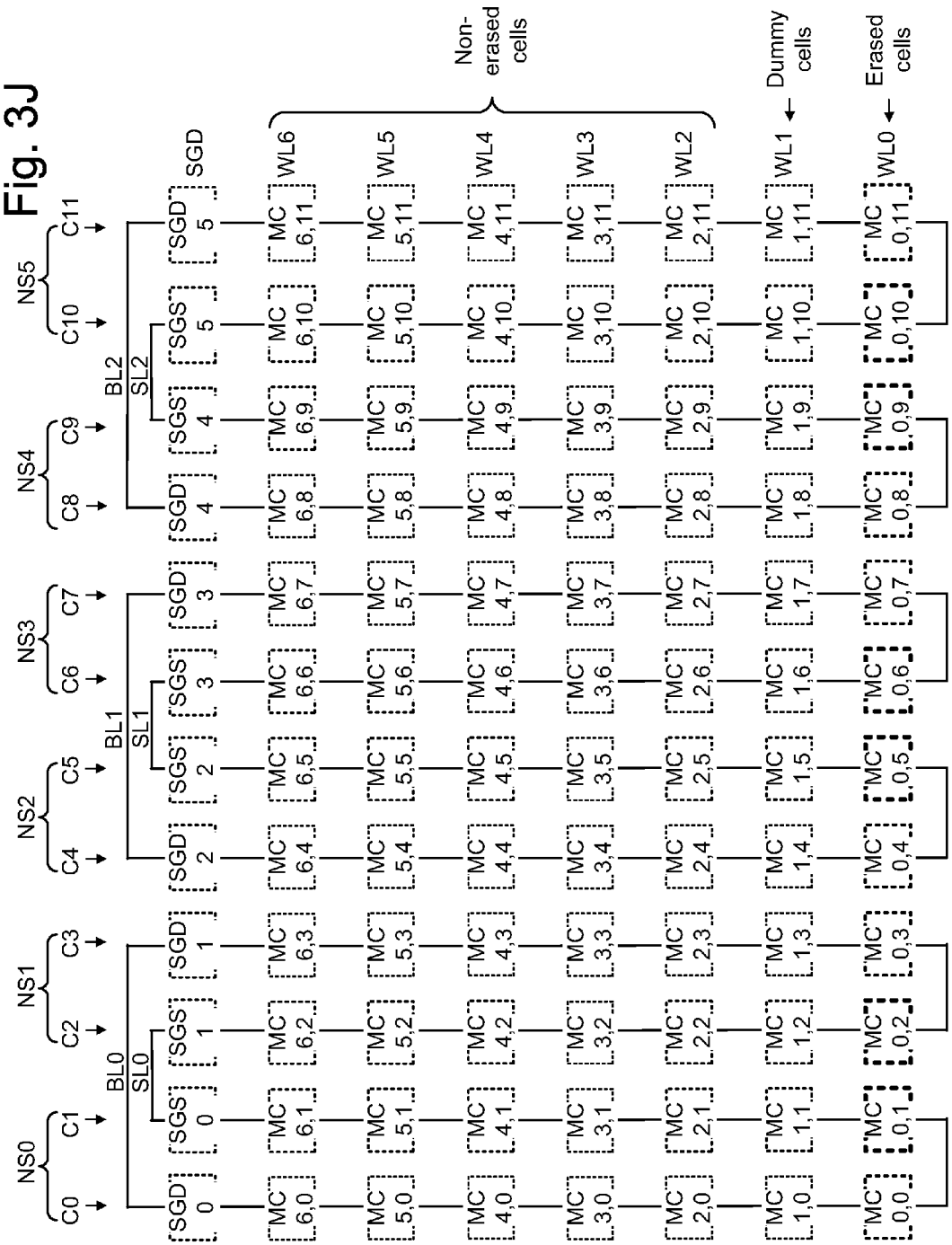

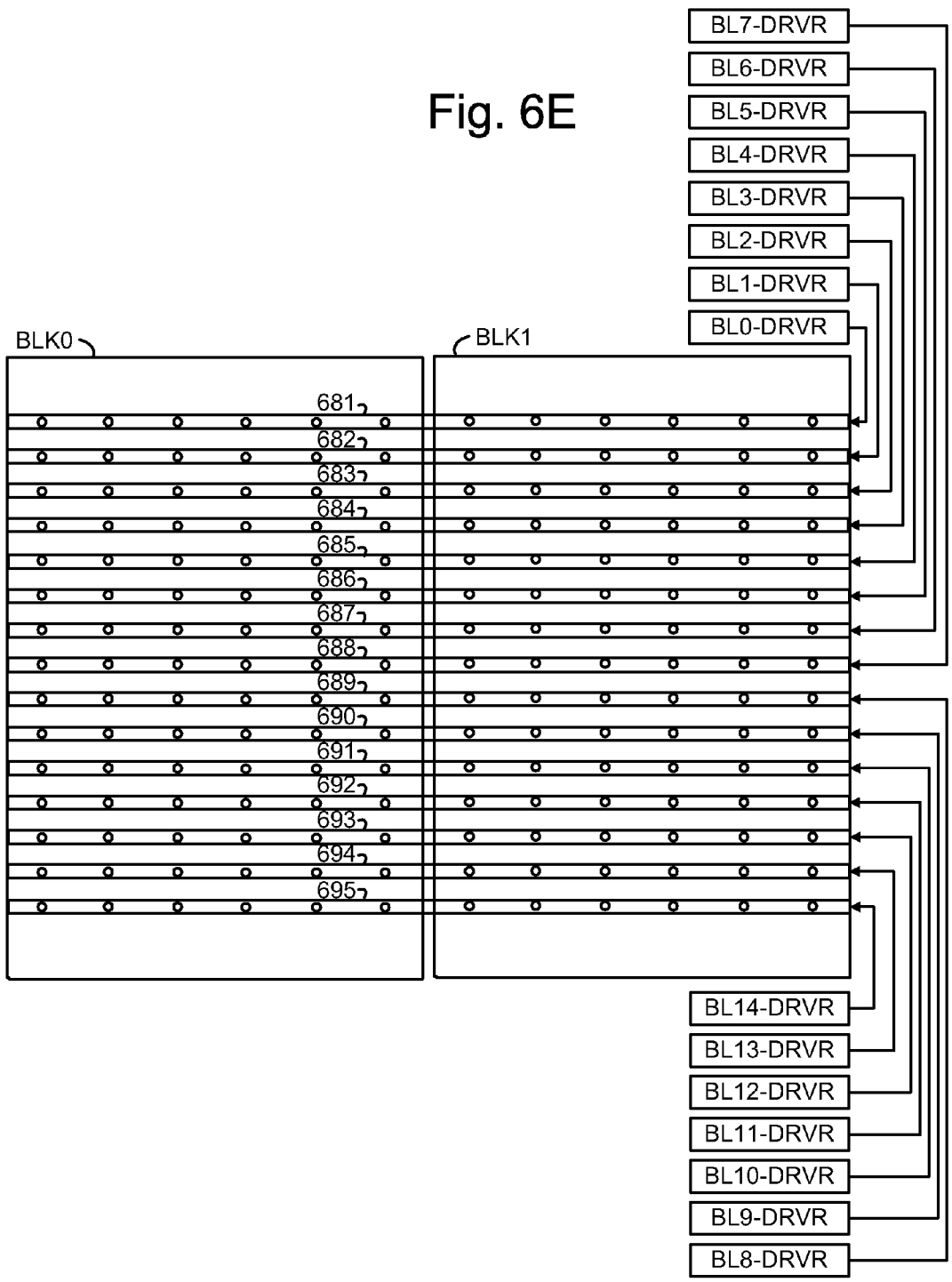

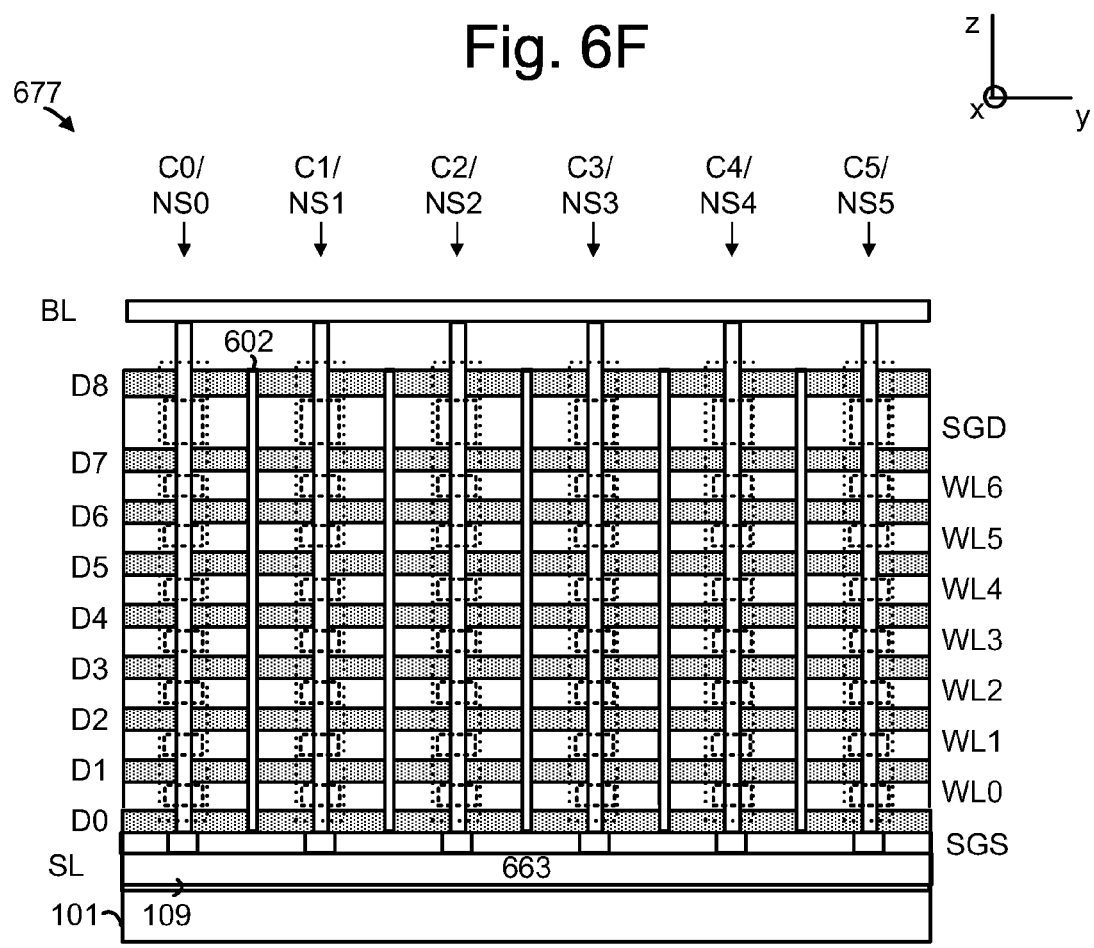

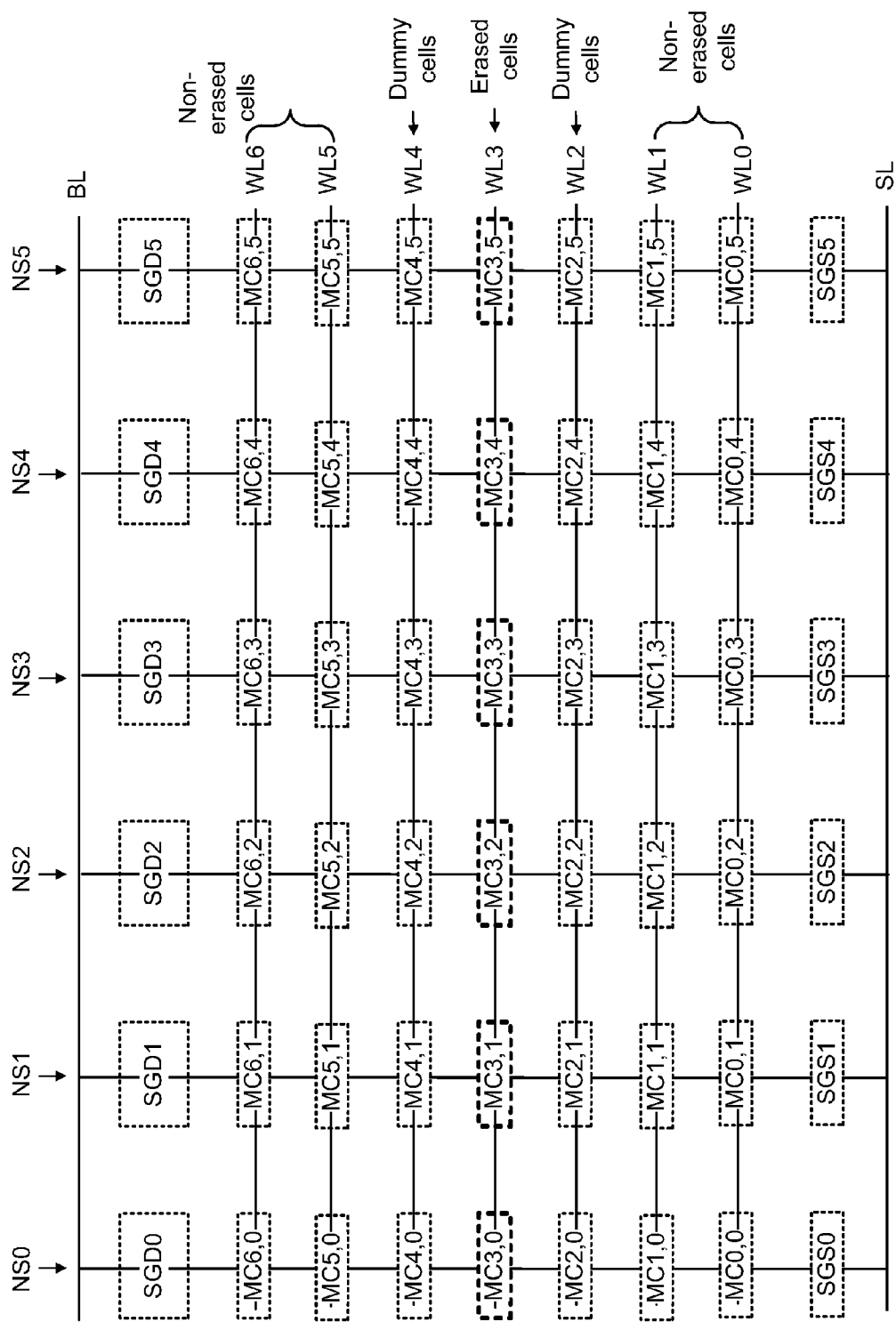

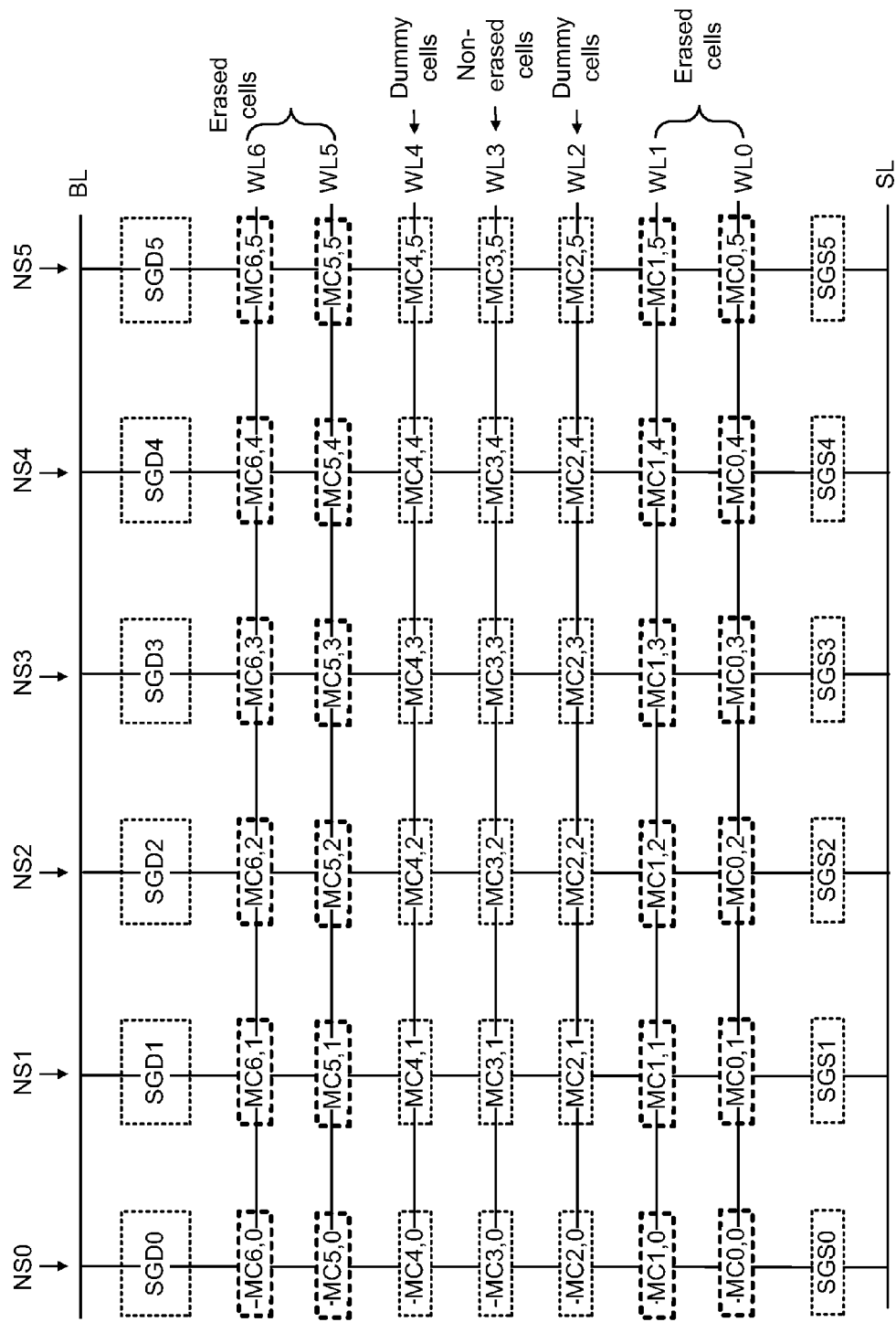

SELECTIVE WORD LINE ERASE IN 3D NON-VOLATILE MEMORY

CLAIM OF PRIORITY

This application is a divisional application of U.S. patent application Ser. No. 13/287,343 filed on Nov. 2, 2011, published as U.S. 2013/0107628 on May 2, 2013 and issued as U.S. Pat. No. 8,897,070 on Nov. 25, 2014, entitled, "Selective Word Line Erase In 3d Non-Volatile Memory," incorporated by reference herein in its entirety.

BACKGROUND OF THE INVENTION

1. Field of the Invention

The present invention relates to techniques for erasing memory cells in a 3D-non-volatile memory device.

2. Description of the Related Art

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

FIG. 2D depicts a top view of a bit line layer of the 3D non-volatile memory device of FIG. 2A, showing bit lines and associated drivers.

FIG. 2F depicts a close-up view of the region 269 of the column C0 of FIG. 2E, showing a drain-side select gate SGD0 and a memory cell MC6,0.

FIG. 2G depicts a cross-sectional view of the column C1 of FIG. 2F.

FIG. 3A depicts one embodiment of a process for selectively erasing the memory cells of FIG. 2E, in which each memory cell in the drain-side columns of memory cells is erased.

FIG. 3B depicts one embodiment of a process for selectively erasing the memory cells of FIG. 2E, in which each memory cell in the source-side columns of memory cells is erased.

FIG. 3J depicts one embodiment of a process for selectively erasing the memory cells of FIG. 2E, in which a subset of memory cells in the source-side columns of memory cells is erased, for an end word line layer, and dummy cells are between the erased memory cells and non-erased memory cells.

FIG. 6E depicts a top view of a bit line layer of the 3D non-volatile memory device of FIG. 6A, showing bit lines and associated drivers.

FIG. 6F depicts a cross-sectional view of a block of the 3D non-volatile memory device of FIG. 6A, along line 600 of FIG. 6A.

FIG. 7C depicts one embodiment of a process for selectively erasing the memory cells of FIG. 6F, in which memory cells in one word line layers are erased, and dummy cells are between the erased memory cells and non-erased memory cells, both above and below the erased memory cells.

FIG. 7D depicts one embodiment of a process for selectively erasing the memory cells of FIG. 6F, in which memory cells in first and second subsets of word line layers are erased, and dummy cells are between the erased memory cells and non-erased memory cells, both above and below the non-erased memory cells.

DETAILED DESCRIPTION

A 3D stacked non-volatile memory device can be arranged in multiple blocks, where typically an erase operation is performed one block at a time. However, the block size is much larger than that in conventional 2D NAND flash memory, for instance, due to the sharing of word line layers among sub-blocks in the 3D device. This sharing is done to reduce the area of the row decoder. As a result, a block erase in the 3D device erases a relatively large portion of the memory cells in the device. This results in inconvenience and lack of flexibility in the memory operation at the system level. Techniques provided herein allow data to be erased in groups of memory cells which are smaller than a block. In one approach, 3D memory devices include U-shaped or straight NAND strings. Additionally, interference which would be caused by capacitive coupling of an erased memory cell to an adjacent (e.g., above or below) memory cell is avoided by the use of dummy memory cells, e.g., memory cells which are ineligible to storage user data.

Like-numbered elements refer to common components in the different figures.

Figure 1A:
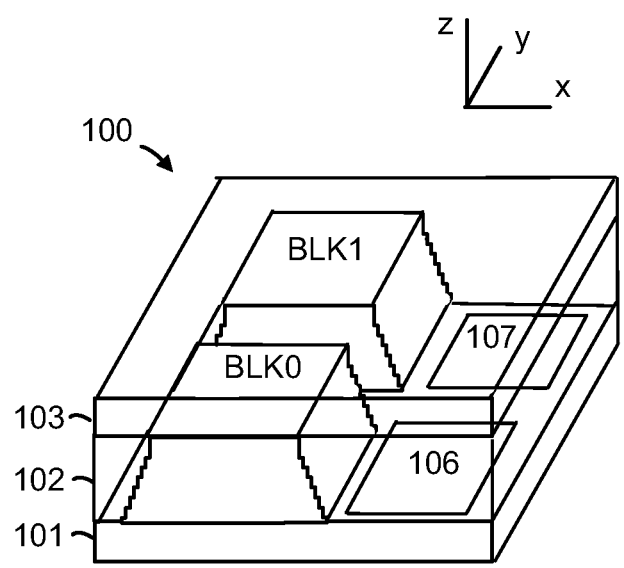
FIG. 1A is a perspective view of a 3D stacked non-volatile memory device.

FIG. 1A is a perspective view of a 3D stacked non-volatile memory device. The memory device 100 includes a substrate 101. On the substrate are example blocks BLK0 and BLK1 of memory cells and associated peripheral areas 106 and 107 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 1B:
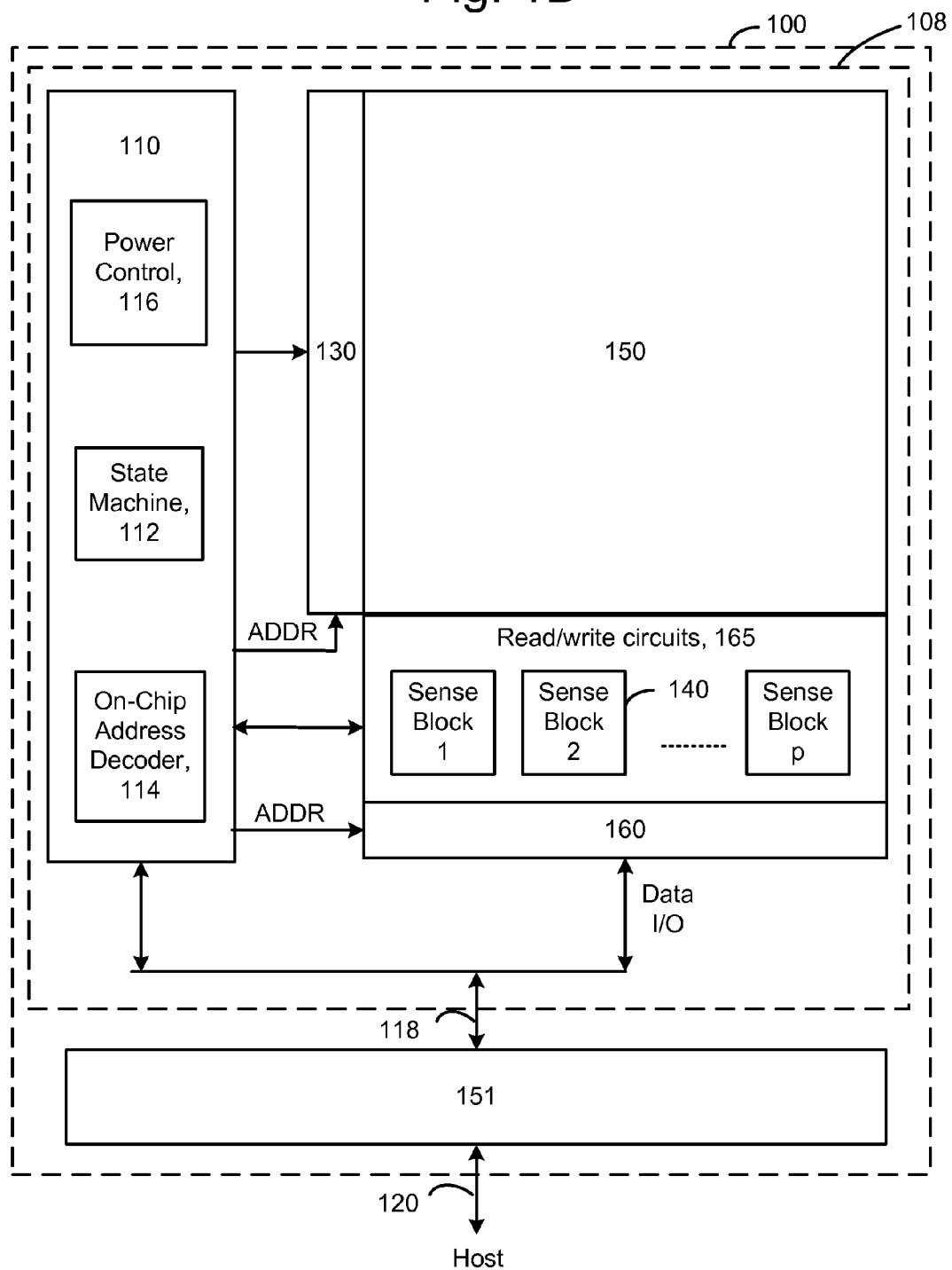
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array of storage elements 150, e.g., including the blocks BLK0 and BLK1, control circuitry 110, and read/write circuits 165. The memory array 150 is addressable by word lines via a row decoder 130 and by bit lines via a column decoder 160. The read/write circuits 165 include multiple sense blocks 140 and allow a page of storage elements to be read or programmed in parallel. Typically a controller 151 is included in the same memory device 100 (e.g., a removable storage card) as the one or more memory die 108. Commands and data are transferred between the host and controller 151 via lines 120 and between the controller and the one or more memory die 108 via lines 118.

The control circuitry 110 cooperates with the read/write circuits 165 to perform memory operations on the memory array 150, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 140 can include bit line drivers, in one approach.

In some implementations, some of the components can be combined. In various designs, one or more of the components (alone or in combination), other than memory array 150, can be thought of as a control circuit. For example, one or more control circuits may include any one of, or a combination of, control circuitry 110, state machine 112, decoders 114/160, power control 116, sense blocks 140, read/write circuits 165, and controller 151, and so forth.

In another embodiment, a non-volatile memory system uses dual row/column decoders and read/write circuits. Access to the memory array 150 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 150. In this way, the density of the read/write modules is reduced by one half.

Other types of non-volatile memory in addition to NAND flash memory can also be used.

Figure 2A:
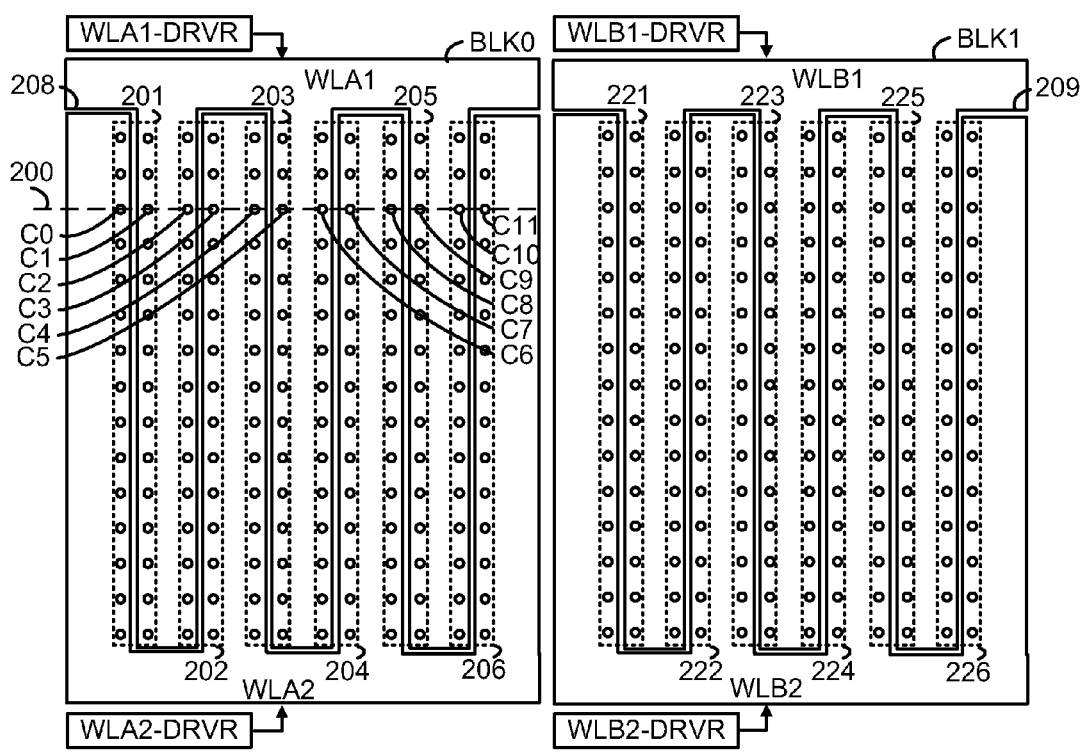
FIG. 2A depicts a top view of a word line layer of a 3D non-volatile memory device having U-shaped NAND strings, showing word line layer portions and associated drivers.

FIG. 2A depicts a top view of a word line layer of a 3D non-volatile memory device having U-shaped NAND strings, showing word line layer portions and associated drivers. This is a representative layer among the multiple word line layers in a stack. Referring also to FIG. 2E, the stack includes alternating dielectric and conductive layers. The dielectric layers include D0 to D8 and may be made of SiO2, for instance. The conductive layers include BG, which is a back gate layer, WL0 to WL6, which form word line layers, e.g., conductive paths to control gates of the memory cells at the layer, and SG, which forms a select gate layer, e.g., a conductive path to control gates of select gates of NAND strings. The word line layer of FIG. 2A may represent any one of WL0 to WL6, for instance. The conductive layers may include doped polysilicon or metal silicide, for instance. An example voltage of 5-10 V may be applied to the back gate to maintain a conductive state which connects the drain- and source-side columns.

FIG. 2A depicts the blocks BLK0 and BLK1 as an example. For each block, the word line layer is divided into two word line layer portions, e.g., word line layer portions WLA1 and WLA2 in BLK0, and word line layer portions WLB1 and WLB2 in BLK1. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 208 of BLK0 is a single continuous slit which extends in a zig-zag pattern in the block so that the block is divided into two portions, WLA1 and WLA2, which are insulated from one another. Similarly, a slit 209 of BLK1 divides BLK1 into two portions, WLB1 and WLB2, which are insulated from one another. This approach can provide greater flexibility in controlling the memory cells since the word line layer portions can be drive independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells in BLK0 along a line 200 includes C0 to C11. The figure represents a simplification, as many more rows of memory holes will typically be used, extending to the right and left in the figure. Also, the figures are not necessarily to scale. The columns of memory cells can be arranged in sub-groups 201 to 206 in BLK0 and 221 to 226 in BLK1. When U-shaped NAND strings are used, each sub-group can include two adjacent rows of columns of memory cells. In a sub-group, the adjacent rows are separated by the slit. The columns of memory cells on one side of the slit are drain-side columns (e.g., C0, C3, C4, C7, C8 and C11 in FIG. 2E), and the columns of memory cells on the other side of the slit are source-side columns (e.g., C1, C2, C5, C6, C9 and C10 in FIG. 2E). Note the pattern of two source-side columns between two drain-side columns repeats in the y-direction.

Word line drivers WLA1-DRVR, WLA2-DRVR, WLB1-DRVR and WLB2-DRVR independently provide signals such as voltage waveforms to the word line layer portions WLA1, WLA2, WLB1 and WLB2, respectively.

Figure 2B:
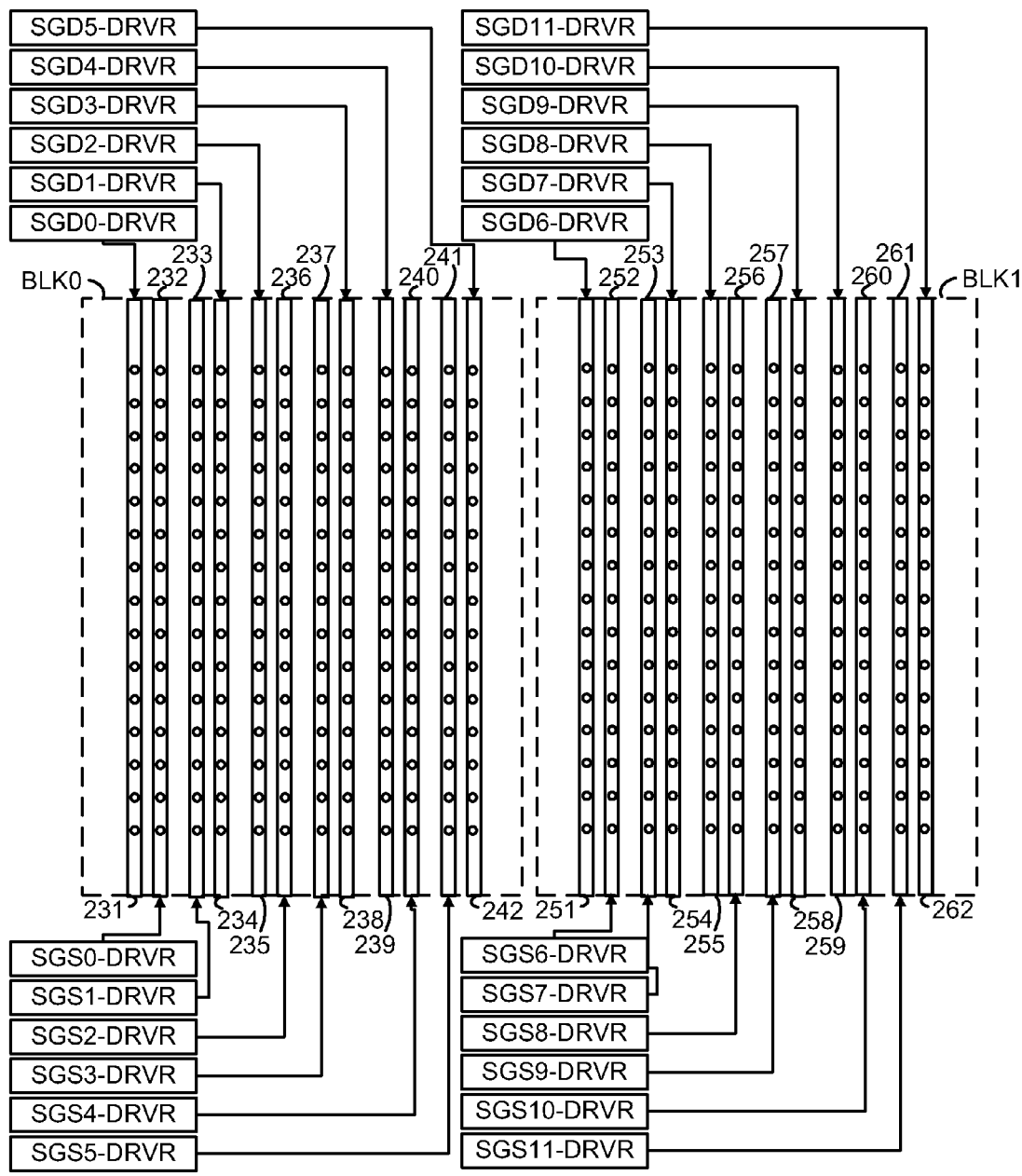
FIG. 2B depicts a top view of a select gate layer of the 3D non-volatile memory device of FIG. 2A, showing drain-side select gate lines, source-side select gate lines and associated drivers.

FIG. 2B depicts a top view of a select gate layer of the 3D non-volatile memory device of FIG. 2A, showing drain-side select gate lines, source-side select gate lines and associated drivers. For example, this can represent layer SG of FIG. 2E.

A separate select gate line, e.g., a conductive line or path, is associated with each row of columns of memory cells. Moreover, separate select gate lines can be connected to the drain- and source-side columns of a U-shaped NAND string. For example, BLK0 includes drain-side select gate lines 231, 234, 235, 238, 239 and 242, which are driven by select gate drivers SGD0-DRVR to SGD5-DRVR, respectively, and source-side select gate lines 232, 233, 236, 237, 240 and 241, which are driven by select gate drivers SGSD0-DRVR to SGS5-DRVR, respectively. Similarly, BLK1 includes drain-side select gate lines 251, 254, 255, 258, 259 and 262, which are driven by select gate drivers SGD6-DRVR to SGD11-DRVR, respectively, and source-side select gate lines 252, 253, 256, 257, 260 and 261, which are driven by select gate drivers SGS6-DRVR to SGS11-DRVR, respectively. The select gate drivers provide signals such as voltage waveforms to the select gate lines.

Figure 2C:
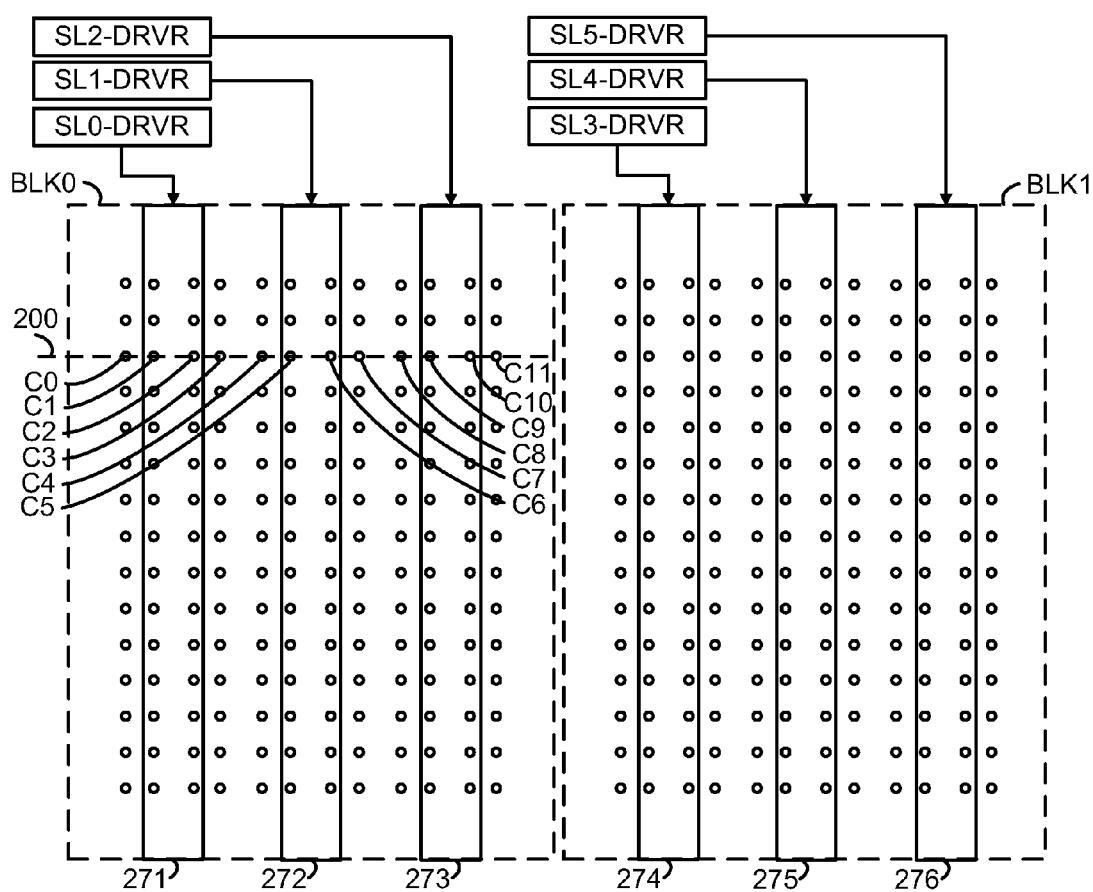
FIG. 2C depicts a top view of a source line layer of the 3D non-volatile memory device of FIG. 2A, showing source lines and associated drivers.
Figure 2E:
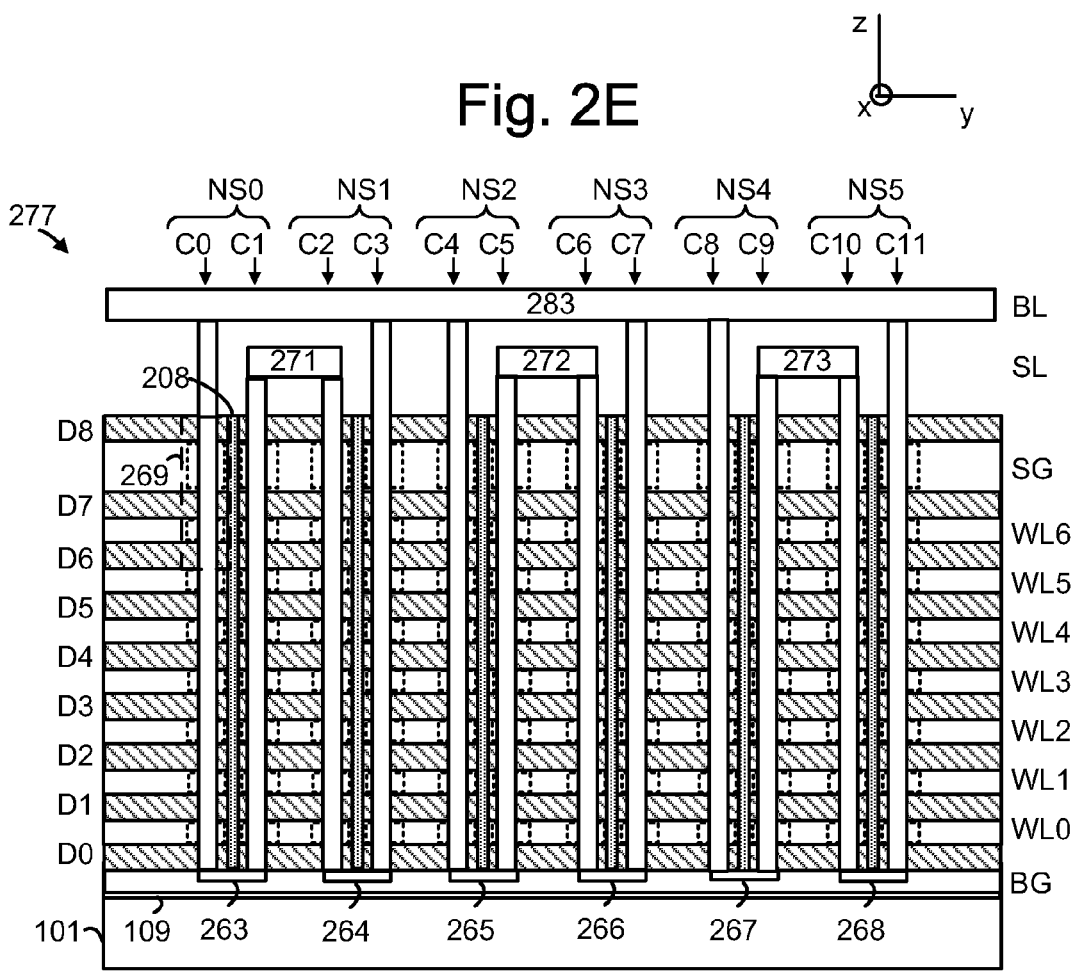
FIG. 2E depicts a cross-sectional view of a block of the 3D non-volatile memory device of FIG. 2A, along line 200 of FIG. 2A.

FIG. 2C depicts a top view of a source line layer of the 3D non-volatile memory device of FIG. 2A, showing source lines and associated drivers. For example, this can represent layer SL of FIG. 2E. A source line, e.g., a conductive line or path, is associated with pairs of rows of source-side columns of memory cells. A source line is connected to a source-side end of a U-shaped or straight NAND string. For example, BLK0 includes source lines 271 (e.g., connected to C0 and C1), 272 (e.g., connected to C5 and C6) and 273 (e.g., connected to C9 and C10). Similarly, BLK1 includes source lines 274, 275 and 276. The source line drivers provide signals such as voltage waveforms to the source lines. For example, SL0-DRVR to SL2-DRVR provide signals to source lines 271 to 273, respectively, and SL3-DRVR to SL5-DRVR provide signals to source lines 274 to 276, respectively.

FIG. 2D depicts a top view of a bit line layer of the 3D non-volatile memory device of FIG. 2A, showing bit lines and associated drivers. For example, this can represent layer BL of FIG. 2E. A bit line, e.g., a conductive line or path, is associated with a set of columns of memory cells which extend in a horizontal line in the figure. A bit line extends across multiple blocks which are adjacent laterally of one another. A bit line is connected to a drain-side end of a U-shaped or straight NAND string, e.g., to a vertical channel or body of the NAND string. For example, bit lines 281 to 295 are driven by bit line drivers BL0-DRVR to BL14-DRVR, respectively. The bit line drivers provide signals such as voltage waveforms to the ends of the NAND strings.

FIG. 2E depicts a cross-sectional view of a block of the 3D non-volatile memory device of FIG. 2A, along line 200 of FIG. 2A. Columns of memory cells C0 to C11 are depicted in the multi-layer stack. The stack 277 includes a substrate 101, an insulating film 109 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 268 which connect the columns. The back gate thus connects the two columns of each U-shaped NAND string. For example, a NAND string (NS) referred to as NS0 includes columns C0 and C1 and connecting portion 263. A NAND string NS1 includes columns C2 and C3 and connecting portion 264. A NAND string NS2 includes columns C4 and C5 and connecting portion 265. A NAND string NS3 includes columns C6 and C7 and connecting portion 266. A NAND string NS4 includes columns C8 and C9 and connecting portion 267. A NAND string NS5 includes columns C10 and C11 and connecting portion 268.

Recall that the additional U-shaped NAND strings in the stack 277 extend in front of and in back of the U-shaped NAND strings depicted in the cross-section, e.g., along the x-axis. The U-shaped NAND strings NS0 to NS5 are each in a different sub-block.

The slit portion 208 from FIG. 2A is also depicted as an example. In the cross-section, multiple slit portions are seen, where each slit portion is between the drain- and source-side columns of a U-shaped NAND string. Portions of the source lines 271 to 273 are also depicted. A portion of the bit line 283 is also depicted.

Short dashed lines depict memory cells and select gates, as discussed further below.

A region 269 of the stack is shown in greater detail in FIG. 2F.

FIG. 2F depicts a close-up view of the region 269 of the column C0 of FIG. 2E, showing a drain-side select gate SGD0 and a memory cell MC6,0. See also FIG. 3A. The region shows portions of the dielectric layers D6 to D8 and the conductive layers WL6 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 296, a nitride such as SiN as a charge trapping layer can be deposited as layer 297, a tunnel oxide can be deposited as layer 298, a polysilicon body can be deposited as layer 299, and a core filler dielectric can be deposited as region 300. Additional memory cells are similarly formed throughout the columns.

FIG. 2G depicts a cross-sectional view of the column C0 of FIG. 2F. Each layer is ring-shaped in one possible approach, except the core filler which is cylindrical.

Figure 3A:
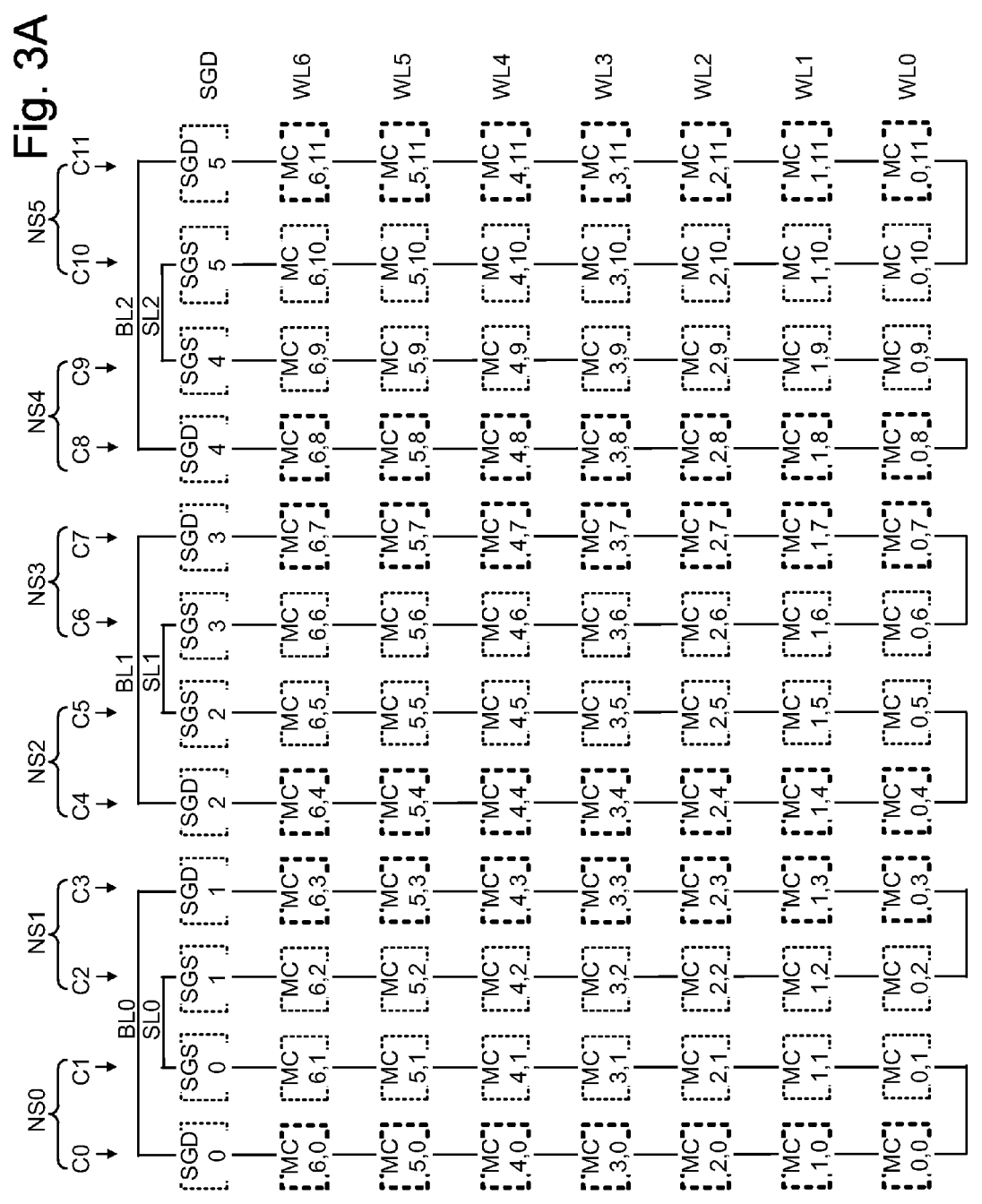

FIG. 3A depicts one embodiment of a process for selectively erasing the memory cells of FIG. 2E, in which each memory cell in the drain-side columns of memory cells is erased. NAND strings NS0 to NS5 and their columns of memory cells are depicted. For convenience, a notation is used in which SGD denotes a drain-side select gate of a NAND string, e.g., the select gate at the top of the drain-side column of a U-shaped NAND string. Each SGD is numbered, starting from 0 and proceeding left to right across the figures, e.g., from SGD0 to SGD5. SGS denotes a source-side select gate of a NAND string, e.g., the select gate at the top of the source-side column of a U-shaped NAND string. Each SGS is also numbered, starting from 0 and proceeding left to right across the figures, e.g., from SGS0 to SGS5.

Each memory cell is numbered in an z,y format where z denotes a word line layer of the memory cell and y denotes the position of the memory cell in the word line layer. For example, memory cells connected to WL0, WL1, WL2, WL3, WL4, WL5 and WL6 are numbered as MC0,0 to MC0,11, MC1,0 to MC1,11, MC2,0 to MC2,11, MC3,0 to MC3,11, MC4,0 to MC4,11, MC5,0 to MC5,11, and MC6,0 to MC6, 11, respectively, proceeding left to right across the figures. WL denotes a word line layer or word line layer portion at a given level or height in the stack.

Additionally, a heavy dashed line border of a memory cell indicates a selected memory cell which has been selected in an erase operation. A lighter dashed line border of a memory cell indicates an unselected memory cell which has not been selected in an erase operation, such as a non-erased memory cell which is eligible to store user data, or a dummy memory cell which is not eligible to store user data. A dummy memory cell can be programmed to any data state, for instance, and is not considered to be eligible to store useful information such as user data or system data. Dummy memory cells can be set aside by the control circuitry and not used to store user data.

In this erase process, all of the memory cells of the drain-side columns are erased, namely MC0,0 to MC6,0, MC0,3 to MC6,3, MC0,4 to MC6,4, MC0,7 to MC6,7, MC0,8 to MC6, 8, and MC0,11 to MC6,11. None of the memory cells of the source-side columns are erased, namely MC0,1 to MC6,1, MC0,2 to MC6,2, MC0,5 to MC6,5, MC0,6 to MC6,6, MC0,9 to MC6,9, and MC0,10 to MC6,10. This approach is convenient since it allows one half of a block to be erased in an erase operation. Moreover, no dummy memory cells are used, so the capacity of the memory device is not reduced by reserving particular memory cells as dummy memory cells.

In this example, each word line layer comprises a selected word line layer portion (e.g., WLA2, FIG. 2A) in communication with memory cells (e.g., MC0,0 to MC6,0; MC0,3 to MC6,3; MC0,4 to MC6,4; MC0,7 to MC6,7; MC0,8 to MC6, 8; and MC0,11 to MC6,11) in the selected columns (e.g., C0, C3, C4, C7, C8, C11) of memory cells, but not with memory cells (e.g., MC0,1 to MC6,1; MC0,2 to MC6,2; MC0,5 to MC6,5; MC0,6 to MC6,6; MC0,9 to MC6,9; and MC0,10 to MC6,10) in the unselected columns (e.g., C1, C2, C5, C6, C9, C10) of memory cells, and an unselected word line layer portion (e.g., WLA1, FIG. 2A) in communication with the memory cells in the unselected columns of memory cells, but not with the memory cells in the selected columns of memory cells. Also, circuitry (e.g., WLA2-DRVR, BL0-DRVR to BL14-DRVR) is in communication with the stacked non-volatile memory cell array, where the circuitry provides voltages to the selected word line layer portions and to an end of each selected column of memory cells, to perform an erase operation which erases at least one memory cell in each selected column of memory cells. Circuitry (e.g., WLA1-DRVR, SL0-DRVR to SL2-DRVR) provides voltages to the unselected word line layer portions and an end of each unselected column of memory cells, to not erase any memory cells in each unselected column of memory cells during the erase operation.

Figure 3B:
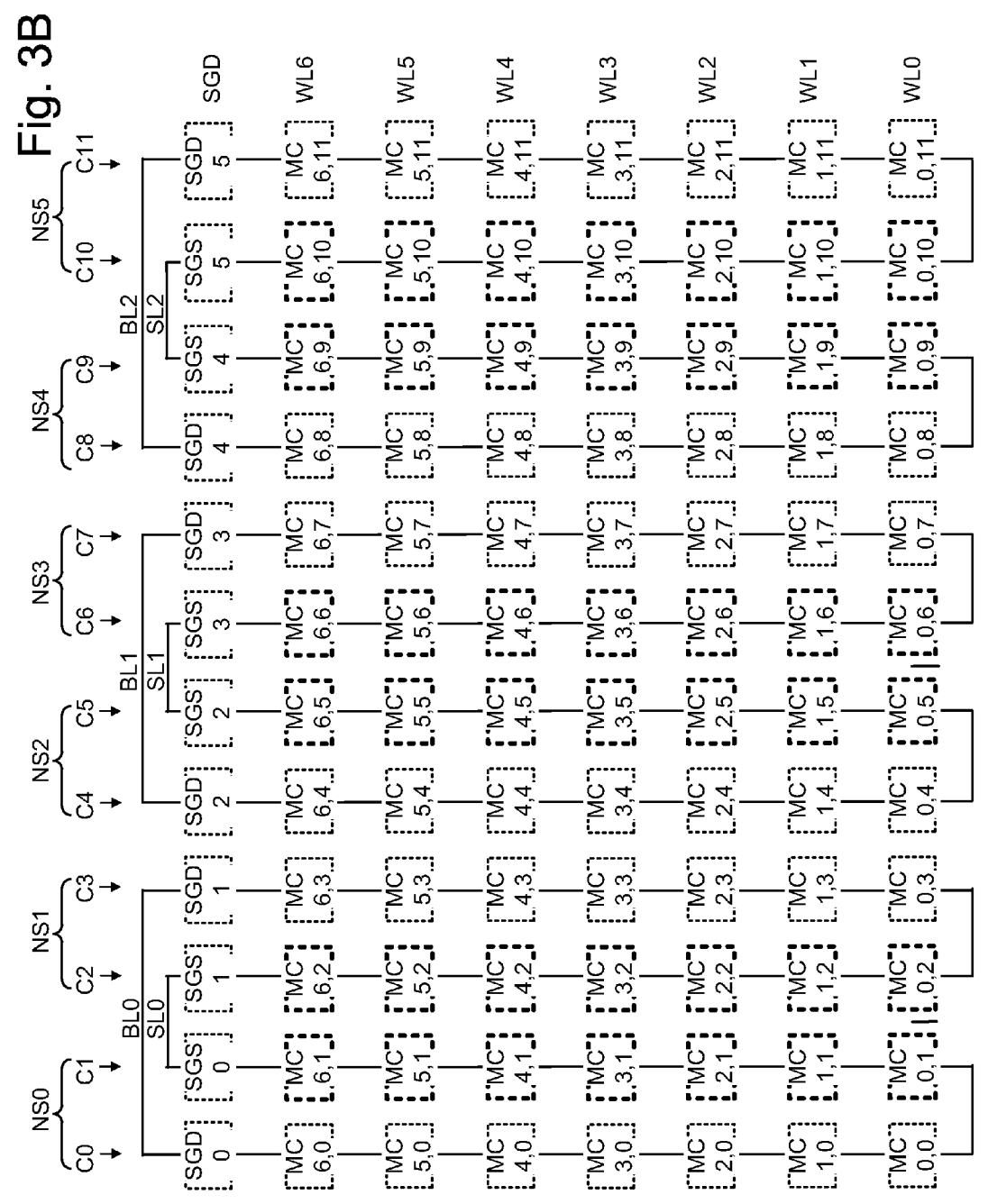

FIG. 3B depicts one embodiment of a process for selectively erasing the memory cells of FIG. 2E, in which each memory cell in the source-side columns of memory cells is erased. This example also allows one half of a block to be erased in an erase operation. In particular, all of the memory cells of the source-side columns are erased, namely MC0,1 to MC6,1, MC0,2 to MC6,2, MC0,5 to MC6,5, MC0,6 to MC6, 6, MC0,9 to MC6,9, and MC0,10 to MC6,10. None of the memory cells of the drain-side columns are erased, namely MC0,0 to MC6,0, MC0,3 to MC6,3, MC0,4 to MC6,4, MC0,7 to MC6,7, MC0,8 to MC6,8, and MC0,11 to MC6,11. This approach is convenient since it allows one half of a block to be erased in an erase operation, and since no dummy memory cells are used.

Figure 3C:
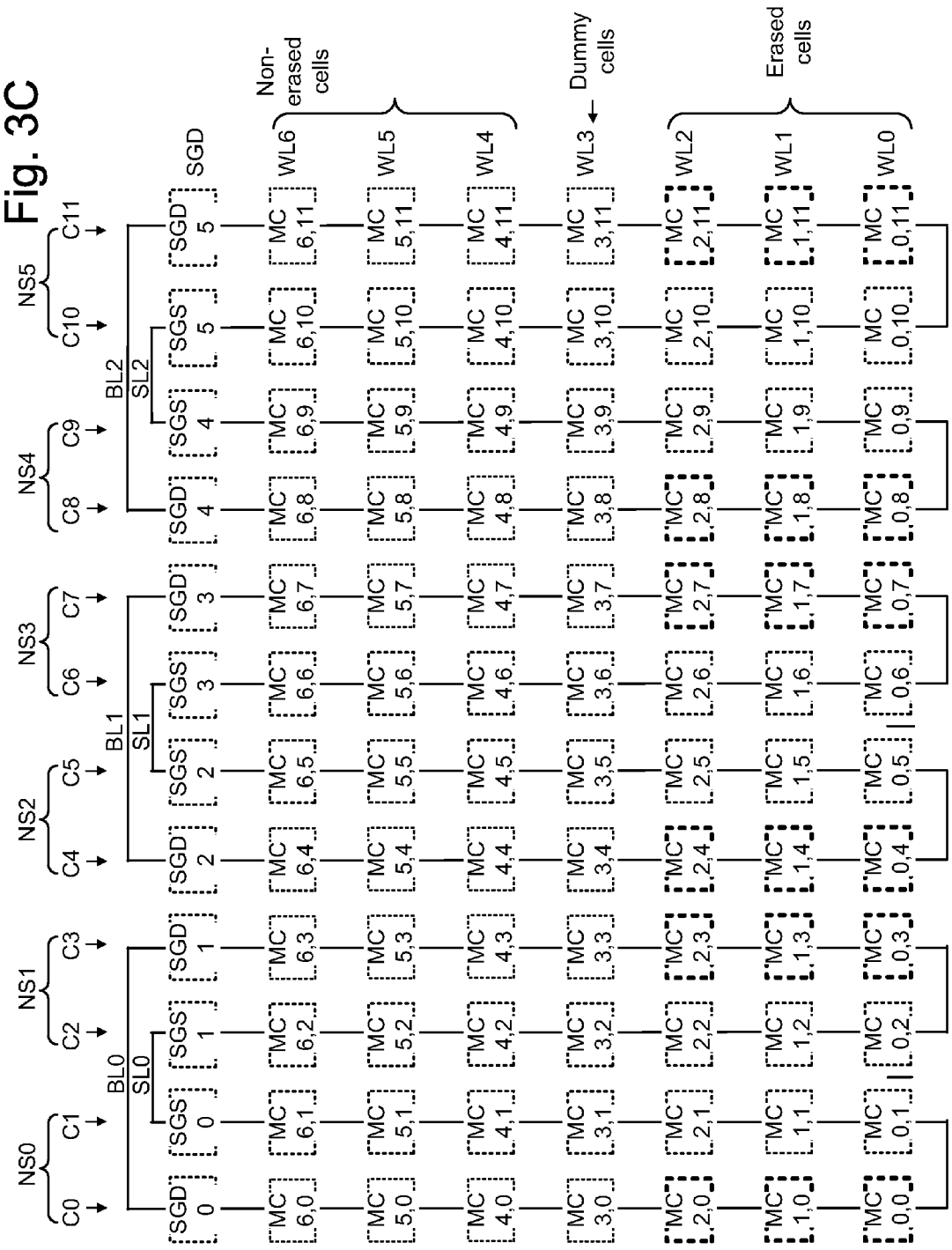
FIG. 3C depicts one embodiment of a process for selectively erasing the memory cells of FIG. 2E, in which a subset of memory cells in the drain-side columns of memory cells is erased, and dummy cells are between the erased memory cells and non-erased memory cells.

FIG. 3C depicts one embodiment of a process for selectively erasing the memory cells of FIG. 2E, in which a subset of memory cells in the drain-side columns of memory cells is erased, and dummy cells are between the erased memory cells and non-erased memory cells. During an erase operation, as discussed also in FIG. 5A to 5E, a voltage of the channel or body in a column of memory cells is initially raised as a voltage is applied to the drain-end of a NAND string via the bit line, and/or to the source-end of a NAND string via the source line. A voltage of one or more associated word line layer portions is floated and capacitively coupled higher by the increase in the voltage of the channel or body. The one or more associated word line layer portions are connected to memory cells which are to be erased. Subsequently, the voltage of the one or more word line layer portions is driven down, e.g., to 0 V, injecting holes from the body to the charge trapping layer, result in a large decrease in the threshold voltage (Vth) of the memory cells to be erased. However, this large decrease in the Vth can cause interference to an adjacent non-erased memory cell, directly above or below the memory cell to be erased. This interference decreases the Vth of adjacent non-erased memory cell due to capacitive or electric field coupling. The decrease in Vth of the adjacent non-erased memory cell is less than the decrease in Vth of the erased memory cell but is still undesirable since it can corrupt the data stored on the adjacent non-erased memory cell.

One solution is the use of a dummy memory cell or word line layer portion between one or more erased memory cells or word line layer portions, and one or more non-erased memory cells or word line layer portions. One dummy memory cell or word line layer portion typically reduces the interference to an acceptable level, although multiple adjacent dummy memory cells or word line layer portions could also be used. The dummy memory cell or word line layer portion reduces the interference by acting as a buffer or spacer between the one or more non-erased memory cells or word line layer portions and the one or more erased memory cells or word line layer portions. When a memory cell is treated as a dummy cell, it is ineligible to store user data as mentioned. This reduces the overall capacity of the memory device as a tradeoff for the flexibility to erase a portion, e.g., a strict subset—less than all, of a block.

In this example, the memory cells of the drain-side columns are erased for a group of multiple adjacent word line layer portions, namely WL0 to WL2. The erased memory cells are MC0,0 to MC2,0, MC0,3 to MC2,3, MC0,4 to MC2,4, MC0,7 to MC2,7, MC0,8 to MC2,8 and MC0,11 to MC2,11. The memory cells of the drain-side columns are not erased for another group of multiple adjacent word line layer portions, namely WL4 to WL6. Further, the word line layer portion WL3 is a dummy word line layer portion, and memory cells MC3,0 to MC3,11 are dummy memory cells. None of the memory cells of the source-side columns are erased, for any word line, in this example. In this approach, 3/14 (3/7×1/2) of a block is erased.

In this example, a dummy memory cell (e.g., MC3,0, MC3,3, MC3,4, MC3,7, MC3,8, MC3,11) which is ineligible to store user data is between the at least one memory cell which is erased (e.g., MC2,0, MC2,3, MC2,4, MC2,7, MC2,8, MC2,11, respectively) and at least one memory cell which is not erased (e.g., MC4,0, MC4,3, MC4,4, MC4,7, MC4,8, MC4,11, respectively) and which is eligible to store user data.

Figure 3D:
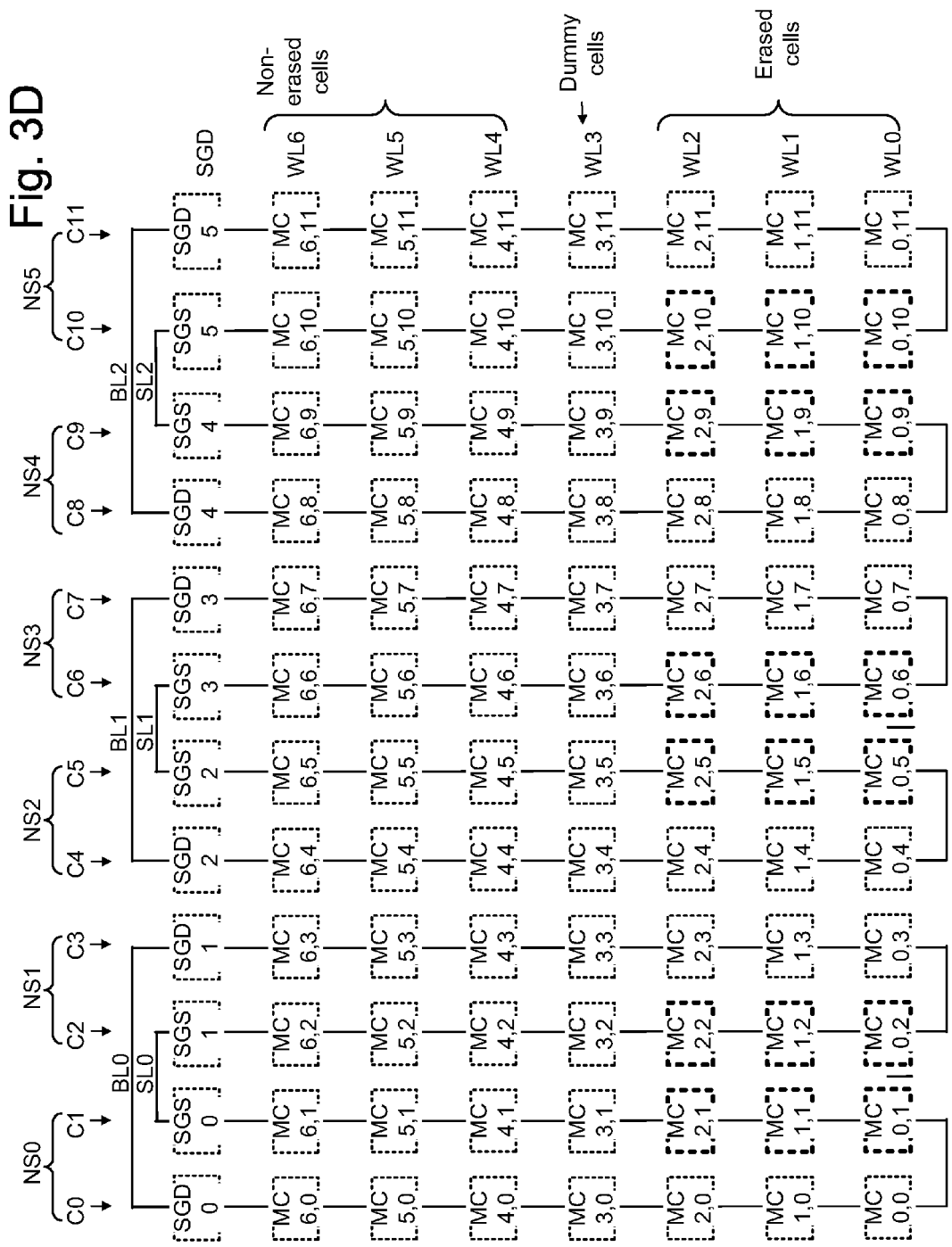
FIG. 3D depicts one embodiment of a process for selectively erasing the memory cells of FIG. 2E, in which a subset of memory cells in the source-side columns of memory cells is erased, and dummy cells are between the erased memory cells and non-erased memory cells.

FIG. 3D depicts one embodiment of a process for selectively erasing the memory cells of FIG. 2E, in which a subset of memory cells in the source-side columns of memory cells is erased, and dummy cells are between the erased memory cells and non-erased memory cells. The memory cells of the source-side columns are erased for a group of multiple adjacent word line layer portions, namely WL0 to WL2. The erased memory cells are MC0,1 to MC2,1, MC0,2 to MC2,2, MC0,5 to MC2,5, MC0,6 to MC2,6, MC0,9 to MC2,9 and MS0,10 to MC2,10. The memory cells of the source-side columns are not erased for another group of multiple adjacent word line layer portions, namely WL4 to WL6. The word line layer portion WL3 is a dummy word line layer portion, and memory cells MC3,0 to MC3,11 are dummy memory cells. None of the memory cells of the drain-side columns are erased, for any word line, in this example. In this approach, 3/14 (3/7×1/2) of a block is erased.

Figure 3E:
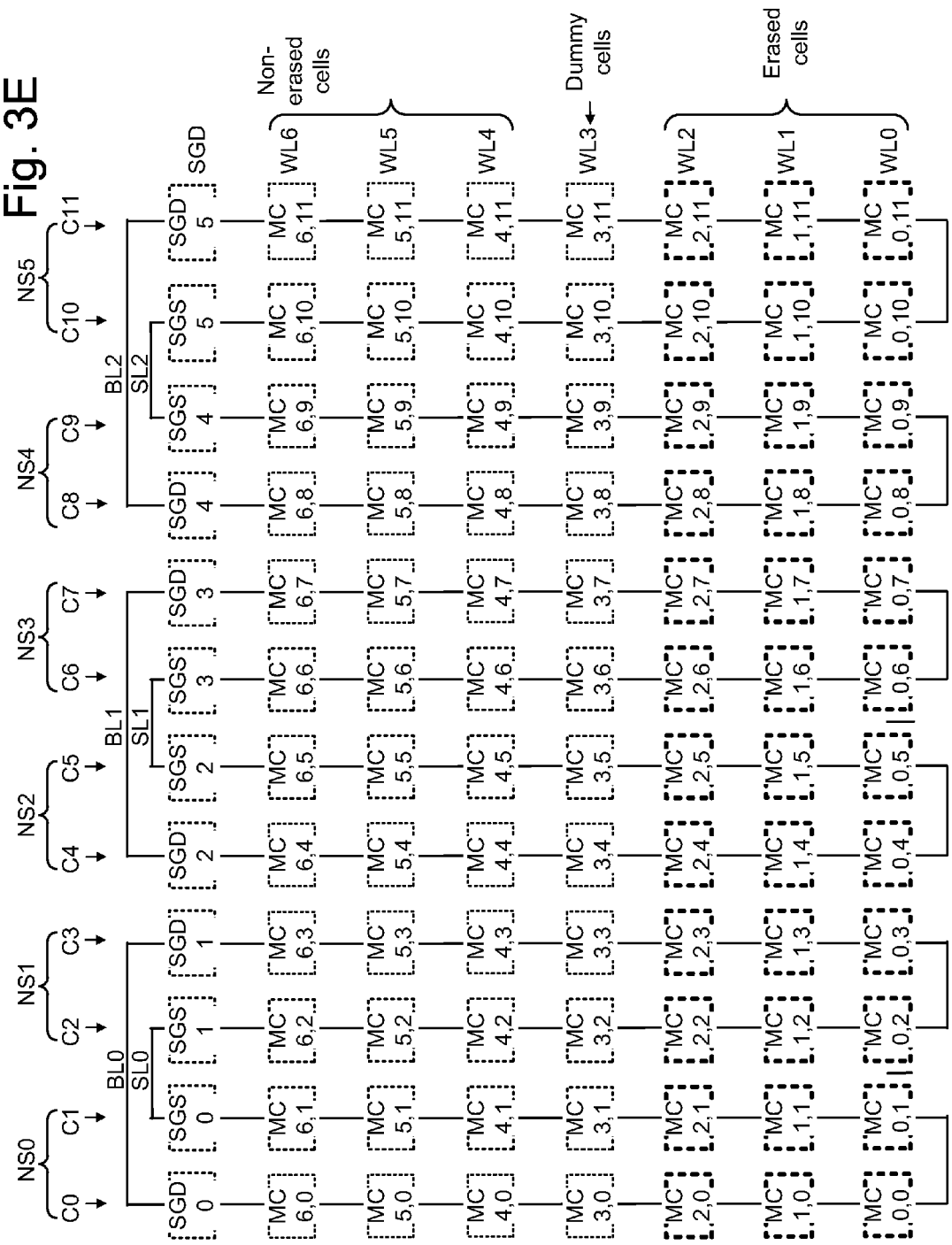
FIG. 3E depicts one embodiment of a process for selectively erasing the memory cells of FIG. 2E, in which a subset of memory cells in the drain- and source-side columns of memory cells is erased, and dummy cells are between the erased memory cells and non-erased memory cells.

FIG. 3E depicts one embodiment of a process for selectively erasing the memory cells of FIG. 2E, in which a subset of memory cells in the drain- and source-side columns of memory cells is erased, and dummy cells are between the erased memory cells and non-erased memory cells. The memory cells of the source- and drain-side columns are erased for a group of multiple adjacent word line layer portions, namely WL0 to WL2. The erased memory cells are MC0,0 to MC0,11, MC1,0 to MC1,11, MC2,0 to MC2,11. The memory cells of the source- and drain-side columns are not erased for another group of multiple adjacent word line layer portions, namely WL4 to WL6. The word line layer portion WL3 is a dummy word line layer portion, and memory cells MC3,0 to MC3,11 are dummy memory cells. In this approach, 3/7 of a block is erased.

Figure 3F:
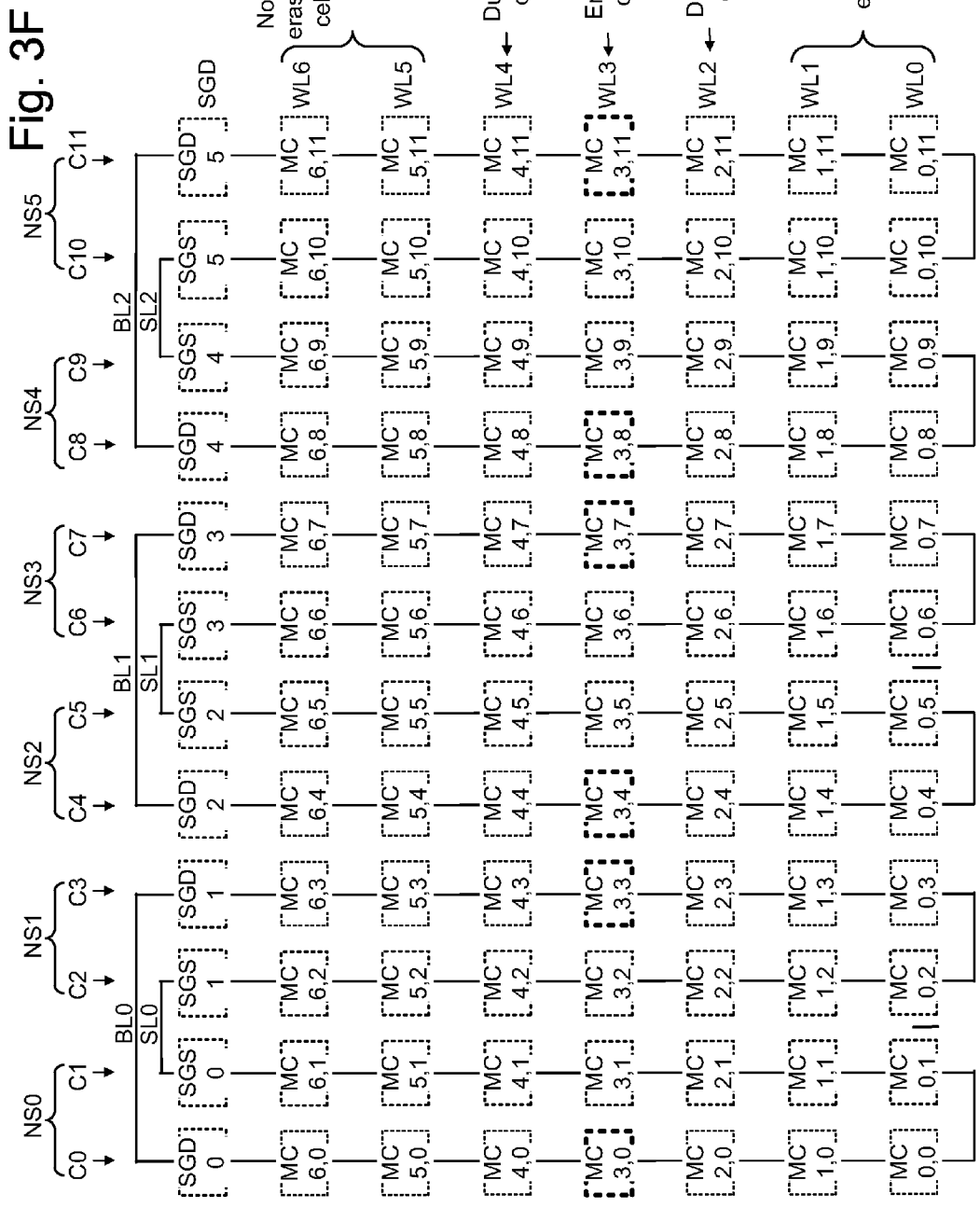
FIG. 3F depicts one embodiment of a process for selectively erasing the memory cells of FIG. 2E, in which a subset of memory cells in the drain-side columns of memory cells is erased, and dummy cells are between the erased memory cells and non-erased memory cells, both above and below the erased memory cells.

FIG. 3F depicts one embodiment of a process for selectively erasing the memory cells of FIG. 2E, in which a subset of memory cells in the drain-side columns of memory cells is erased, and dummy cells are between the erased memory cells and non-erased memory cells, both above and below the erased memory cells.

In this example, the memory cells of the drain-side columns are erased for one word line layer portion, namely WL3. The erased memory cells are MC3,0, MC3,3, MC3,4, MC3,7, MC3,8 and MC3,11. One dummy word line layer portion at WL4 with dummy memory cells MC4,0 to MC4,11 is above the erased memory cells, and another dummy word line layer portion at WL2 with dummy memory cells MC2,0 to MC2,11 is below the erased memory cells. Non-erased memory cells are at WL5 and WL6, and WL0 and WL1. The dummy word line layer WL4 prevents or significantly reduces interference to the non-erased memory cells at WL5 when the erased memory cells at WL3 undergo a decrease in their threshold voltage during an erase operation. Similarly, the dummy word line layer WL2 prevents or significantly reduces interference to the non-erased memory cells at WL1 when the erased memory cells at WL3 undergo a decrease in their threshold voltage during an erase operation. In this approach, 1/14 (1/2×1/7) of a block is erased.

In this example, at least one memory cell which is not erased (e.g., MC5,0, MC5,3, MC5,4, MC5,7, MC5,8, MC5,11) during the erase operation is above the at least one memory cell which is erased, and at least one memory cell which is not erased (e.g., MC1,0, MC1,3, MC1,4, MC1,7, MC1,8, MC1,11) during the erase operation is below the at least one memory cell which is erased. Further, a dummy memory cell (e.g., MC4,0, MC4,3, MC4,4, MC4,7, MC4,8, MC4,11) is between (in the same column): the at least one memory cell which is not erased during the erase operation and which is above the at least one memory cell which is erased and the at least one memory cell which is erased. A dummy memory cell (e.g., MC2,0, MC2,3, MC2,4, MC2,7, MC2,8, MC2,11) is between (in the same column): the at least one memory cell which is not erased during the erase operation and which is below the at least one memory cell which is erased and the at least one memory cell which is erased.

Figure 3G:
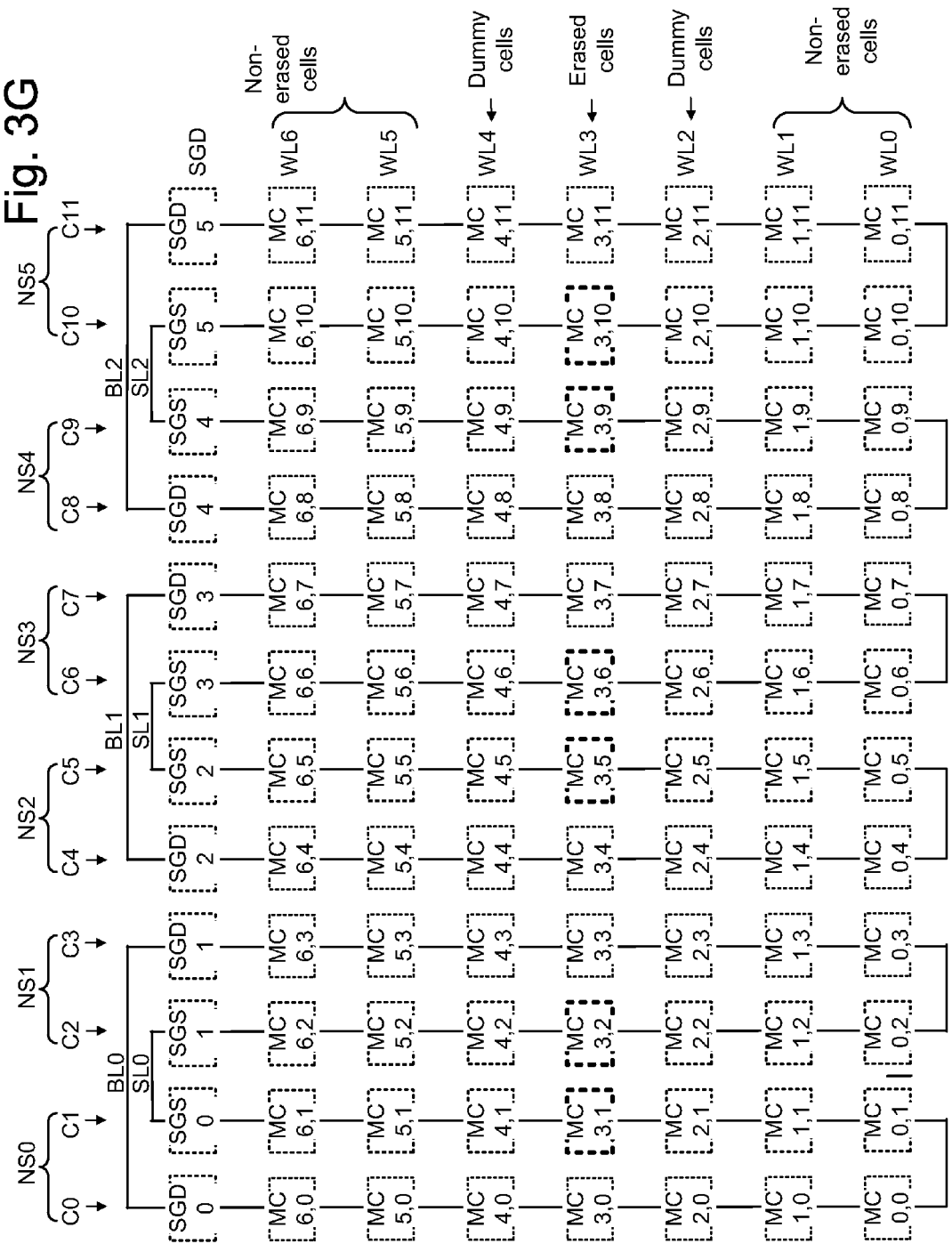
FIG. 3G depicts one embodiment of a process for selectively erasing the memory cells of FIG. 2E, in which a subset of memory cells in the source-side columns of memory cells is erased, and dummy cells are between the erased memory cells and non-erased memory cells, both above and below the erased memory cells.

FIG. 3G depicts one embodiment of a process for selectively erasing the memory cells of FIG. 2E, in which a subset of memory cells in the source-side columns of memory cells is erased, and dummy cells are between the erased memory cells and non-erased memory cells, both above and below the erased memory cells. The erased memory cells are MC3,1 MC3,2, MC3,54, MC3,6, MC3,9 and MC3,10. The dummy word line layer portions are WL4 and WL2, and the non-erased memory cells are at WL5 and WL6, and WL0 and WL1, as in the previous example. In this approach, 1/14 (1/2×1/7) of a block is erased.

Figure 3H:
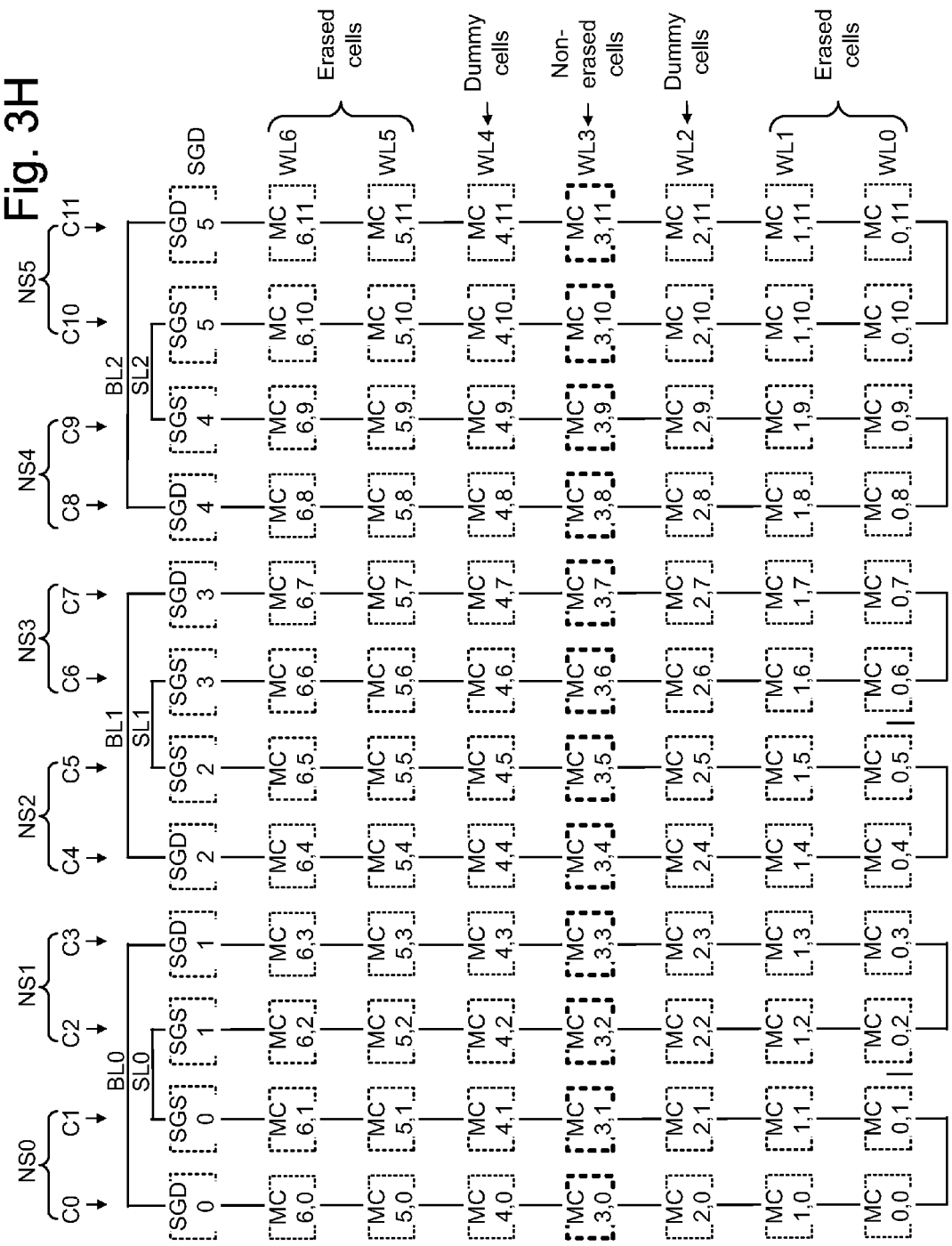
FIG. 3H depicts one embodiment of a process for selectively erasing the memory cells of FIG. 2E, in which a subset of memory cells in the drain- and source-side columns of memory cells is erased, and dummy cells are between the erased memory cells and non-erased memory cells, both above and below the erased memory cells.

FIG. 3H depicts one embodiment of a process for selectively erasing the memory cells of FIG. 2E, in which a subset of memory cells in the drain- and source-side columns of memory cells is erased, and dummy cells are between the erased memory cells and non-erased memory cells, both above and below the erased memory cells. All of the memory cells associated with WL3 are erased, namely MC3,0 to MC3, 11. The dummy word line layer portions are WL4 and WL2, and the non-erased memory cells are at WL5 and WL6, and WL0 and WL1, as in the previous example. In this approach, 1/7 of a block is erased.

Figure 3I:
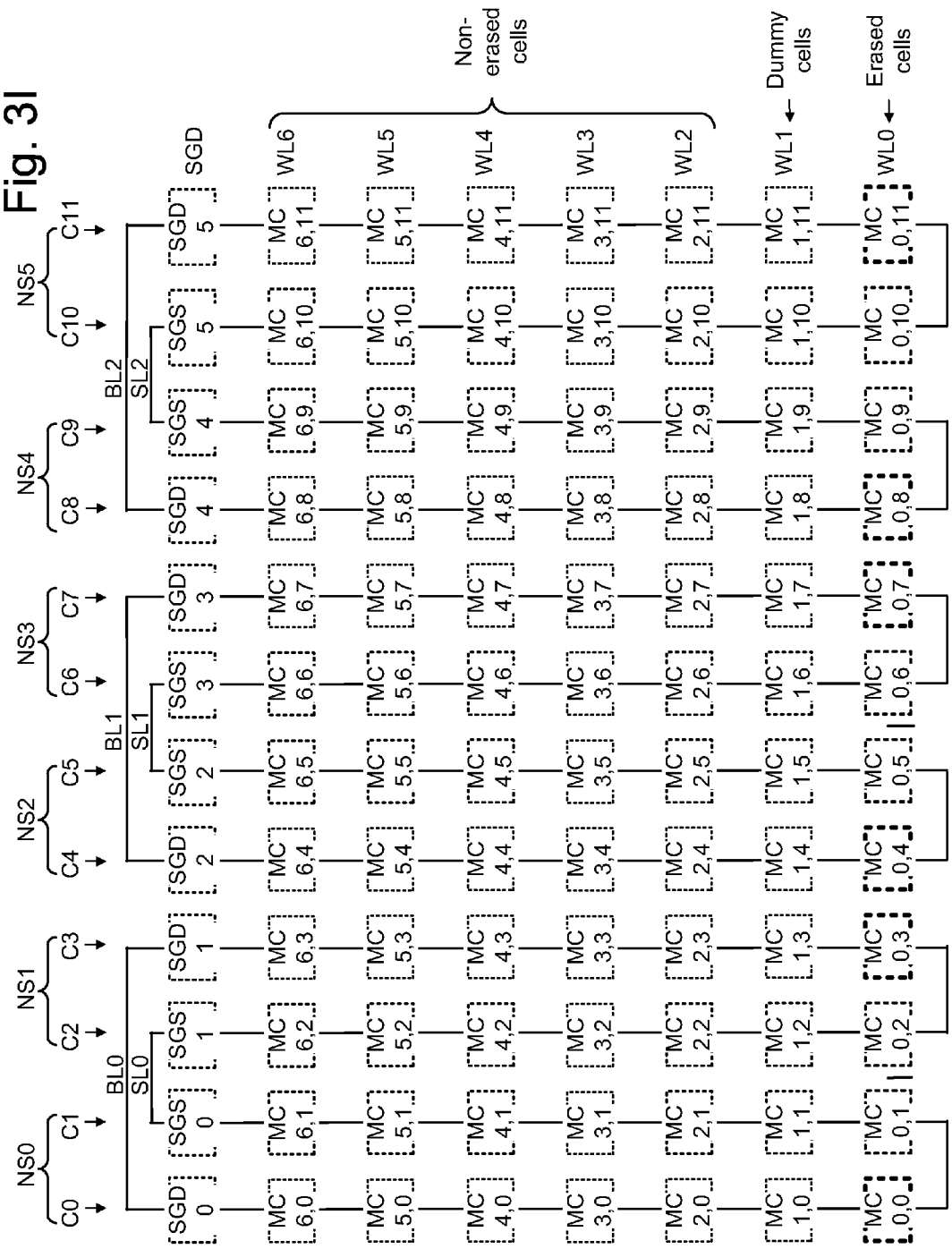
FIG. 3I depicts one embodiment of a process for selectively erasing the memory cells of FIG. 2E, in which a subset of memory cells in the drain-side columns of memory cells is erased, for an end word line layer, and dummy cells are between the erased memory cells and non-erased memory cells.

FIG. 3I depicts one embodiment of a process for selectively erasing the memory cells of FIG. 2E, in which a subset of memory cells in the drain-side columns of memory cells is erased, for an end word line layer, and dummy memory cells are between the erased memory cells and non-erased memory cells. The erased memory cells are at an end word line layer portion, that is, a topmost of bottommost word line layer portion of the stack. The erased memory cells are at the drain-side columns of the bottommost word line layer portion WL0, and include MC0,0, MC0,3, MC0,4, MC0,7, MC0,8 and MC0,11. WL1 is a dummy word line layer portion with dummy memory cells and WL2 to WL6 are non-erased word line layer portions which have not been selected to be erased in an erase operation. Their memory cells are unselected memory cells. In this approach, 1/14 of a block is erased. In an alternative example, the erased memory cells are at the drain-side columns of the topmost word line layer portion, WL6, and include MC6,0, MC6,3, MC6,4, MC6,7, MC6,8 and MC6,11, WL5 is a dummy word line layer portion and WL0 to WL4 are non-erased word line layer portions.

FIG. 3J depicts one embodiment of a process for selectively erasing the memory cells of FIG. 2E, in which a subset of memory cells in the source-side columns of memory cells is erased, for an end word line layer, and dummy cells are between the erased memory cells and non-erased memory cells. The erased memory cells are at the source-side columns of the bottommost word line layer portion WL0, and include MC0,1, MC0,2, MC0,5, MC0,6, MC0,9 and MC0,10. WL1 is a dummy word line layer portion with dummy memory cells and WL2 to WL6 are non-erased word line layer portions which have not been selected to be erased in an erase operation. Their memory cells are unselected memory cells. In this approach, 1/14 of a block is erased. In an alternative example, the erased memory cells are at the source-side columns of the topmost word line layer portion, WL6, and include MC6,1, MC6,2, MC6,5, MC6,6, MC6,9 and MC6,10, WL5 is a dummy word line layer portion and WL0 to WL4 are non-erased word line layer portions.

Figure 3K:
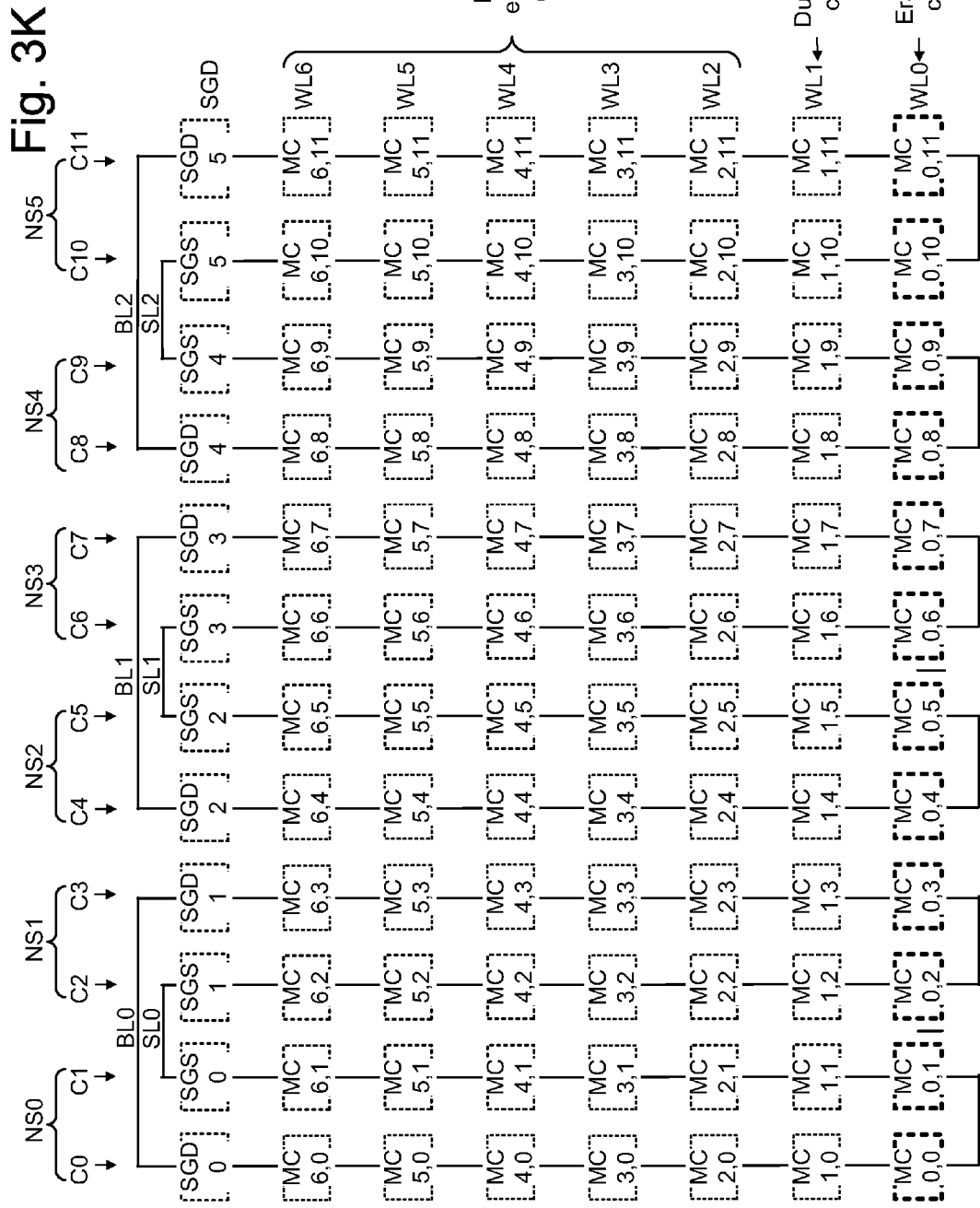
FIG. 3K depicts one embodiment of a process for selectively erasing the memory cells of FIG. 2E, in which a subset of memory cells in the drain- and source-side columns of memory cells is erased, for an end word line layer, and dummy cells are between the erased memory cells and non-erased memory cells.

FIG. 3K depicts one embodiment of a process for selectively erasing the memory cells of FIG. 2E, in which a subset of memory cells in the drain- and source-side columns of memory cells is erased, for an end word line layer, and dummy cells are between the erased memory cells and non-erased memory cells. The erased memory cells are all of the memory cells of WL0, and include MC0,0 to MC0,11. WL1 is a dummy word line layer portion and WL2 to WL6 are non-erased word line layer portions. In this approach, 1/7 of a block is erased. In an alternative example, the erased memory cells are all of the memory cells of the topmost word line layer portion, WL6, and include MC6,0 to MC6,11, WL5 is a dummy word line layer portion and WL0 to WL4 are non-erased word line layer portions.

Figure 4:
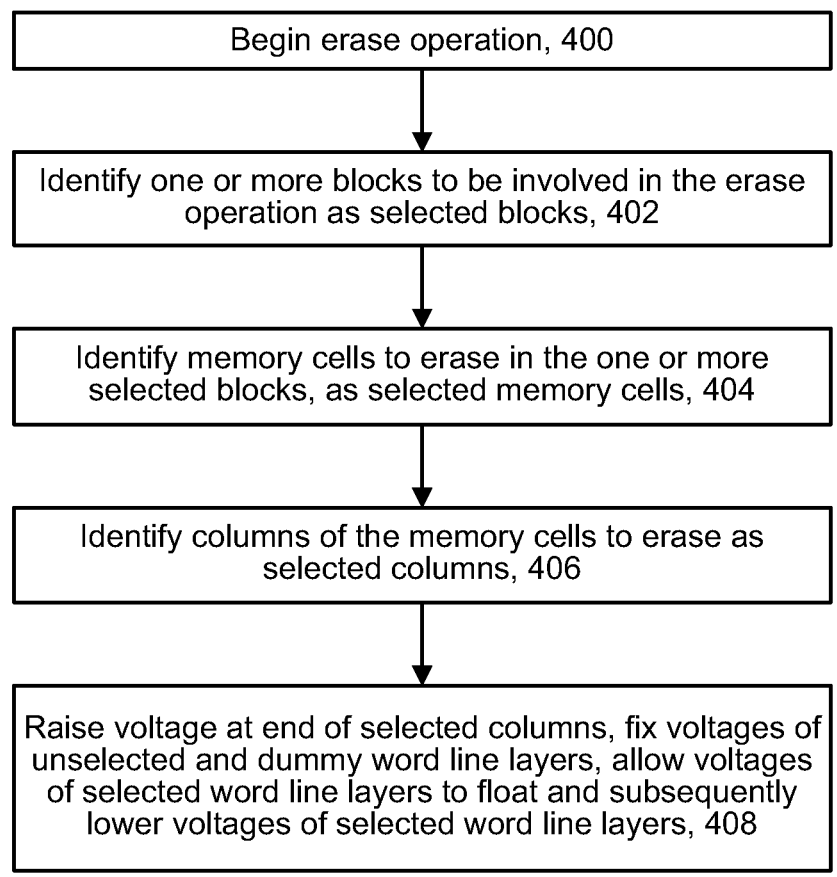
FIG. 4 depicts an erase process.

FIG. 4 depicts an erase process. An erase operation begins at step 400. Step 402 identifies one or more blocks to be involved in the erase operation as selected blocks. A block which is involved in the erased operation has one or more memory cells (e.g., selected memory cells) which are to be erased in the erase operation. One or more blocks which are not to be involved in the erase operation (e.g., blocks which have no selected memory cells, and have only unselected memory cells) are unselected blocks, their word line layers are unselected word line layers, their word line layer portions are unselected word line layer portions, and their memory cells are unselected memory cells. Step 404 identifies memory cells to be erased in the one or more selected blocks, as selected memory cells. Step 406 identifies columns of the memory cells to erase as selected columns. For example, the selected columns can include drain- or source-side columns, or both. A selected column is part of a selected NAND string, for instance. Step 408 includes raising a voltage at one or both ends of the selected columns, fixing voltages of unselected and dummy word line layers, allowing voltages of selected word line layers to float and subsequently lowering voltages of selected word line layers. Thus, in one approach, a dummy word line layer receives the same voltage waveform as an unselected, non-erased memory cell, in an erase operation. However, other options are possible, such as allowing the dummy word line layer to float.

The identifying steps can be performed by control circuitry, and can involve a determination of the one or more selected blocks, memory cells and columns. One or more unselected blocks, memory cells and columns can similarly be identified by the control circuitry. An erase operation can be initiated by control circuitry of the memory device independently of an external host controller, or in response to an external host controller, for instance.

See FIGS. 5A to 5E for additional details. These figures apply, e.g., to an erase operation for a string of series-connected memory cells such as a U-shaped or straight NAND string. FIGS. 5A to 5E have a common time axis but the time increments are not necessarily equally spaced and the figures are not necessarily to scale.

Figure 5A:
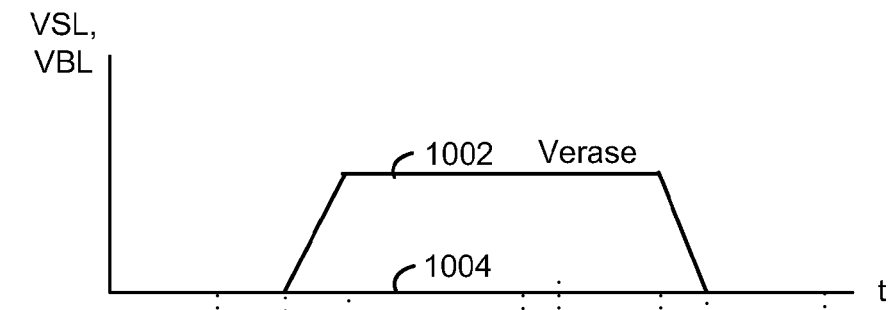
FIG. 5A depicts one embodiment of applied voltages for source lines and bit lines during an erase operation.

FIG. 5A depicts one embodiment of applied voltages for source lines and bit lines during an erase operation. VSL is a voltage applied to a source line which is connected to a source end of a column or string of memory cells. VBL is a voltage applied to a bit line which is connected to a drain end of a column or string of memory cells. A one-sided erase operation can apply a GIDL-inducing voltage to the source or drain end, but not both, while a two-sided erase operation can apply a GIDL-inducing voltage to both the source and drain ends. A waveform 1002 represents VSL and/or VBL for a selected column or string, while a waveform 1004 represents VSL and/or VBL for an unselected column or string. In an example implementation, waveform 1002 is stepped up from t2 to t3, and back down from t6 to t7, and waveform 1004 remains at 0 V. An example amplitude of VSL and VBL is Verase=20-25 V.

Figure 5B:
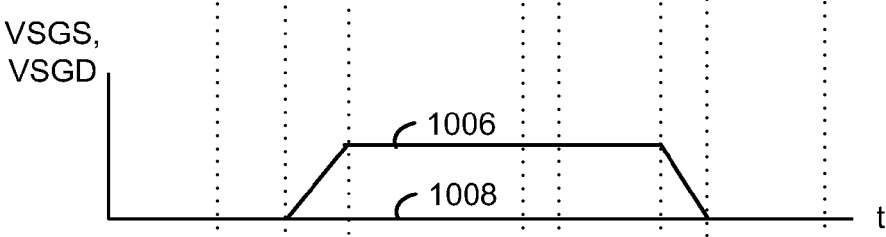
FIG. 5B depicts one embodiment of applied voltages for drain- and source-side select gates during an erase operation.

FIG. 5B depicts one embodiment of applied voltages for drain- and source-side select gates during an erase operation. VSGS is a voltage applied to a source-side select gate, e.g., to the control gate of a transistor, at the source end of a selected column or string of memory cells. VSGD is a voltage applied to a drain-side select gate e.g., to the control gate of a transistor, at the drain end of a selected column or string of memory cells. When erasing is to occur via the source-side of a column of memory cells, VSGS is raised to place the gate in a conductive state so that a gate-induced drain leakage (GIDL) current is produced in the column of memory cells from the source-side select gate. This current charges up the column of memory cells, increasing its voltage. Similarly, when erasing is to occur via the drain-side of a column of memory cells, VSGD is raised to place the gate in a conductive state so that a gate-induced drain leakage current is produced in the column of memory cells from the drain-side select gate. Alternatively, the voltages of the source-side select gate and/or drain-side select gate are allowed to float.

For an unselected column of memory cells, VSGS and VSGD can be set to 0 V to place the gates in a non-conductive state so that little or no boosting of the column of memory cells occurs. A waveform 1006 represents VSGS and/or VSGD for a selected column or string when erasing is to occur via the source- and/or drain-side, respectively, of a column of memory cells. A waveform 1008 represents VSGS and/or VSGD for an unselected column or string. The waveform 1008 could also represent VSGS for a selected column or string when erasing is to occur via the drain-side but not the source-side, or VSGD for a selected column or string when erasing is to occur via the source-side but not the drain-side.

In an example implementation, waveform 1006 is stepped up from t2 to t3, and back down from t6 to t7, and waveform 1008 remains at 0 V. An example amplitude of VSGS and VSGD is 10-15 V.

Figure 5C:
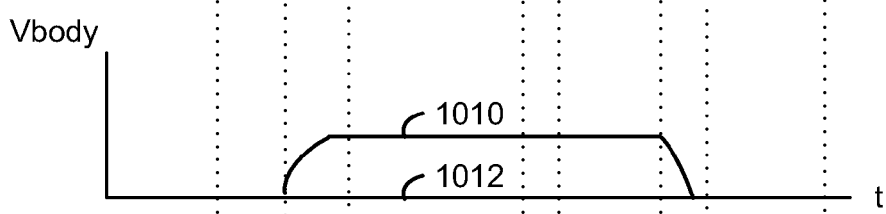
FIG. 5C depicts one embodiment of a voltage of a column of memory cells during an erase operation.

FIG. 5C depicts one embodiment of a voltage (Vbody) of a column of memory cells during an erase operation. Waveform 1012 depicts Vbody, which is at or close to 0 V, for an unselected column. Waveform 1010 depicts Vbody for a selected column, which is boosted due to the increase in VSL and/or VBL and the resulting GIDL. The step up in VSL and/or VBL at waveform 1002 results in an increase in Vbody.

Figure 5D:
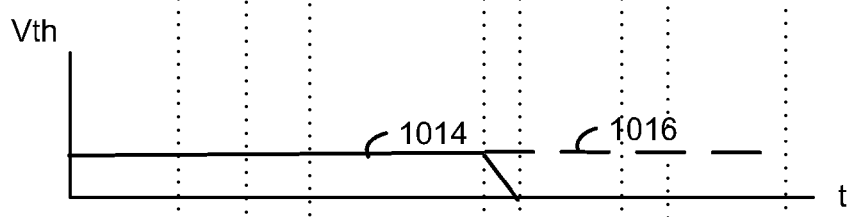
FIG. 5D depicts one embodiment of a threshold voltage of a selected memory cell during an erase operation.

FIG. 5D depicts one embodiment of a threshold voltage of a selected memory cell during an erase operation. As an example, at waveform 1014, the Vth of a memory cell which is selected to be erased decreases from a positive level to a level close to 0 V from t4 to t5, in correspondence with the decrease in the voltage of the associated selected word line layer or word line layer portion VWL (see FIG. 5E). The Vth of a memory cell can represent one of a number of available data states, e.g., 2, 4, 8 or 16 data states. Each data state can be associated with a range of Vth values. When a memory cell is programmed, it is programmed so that its Vth is within one of the ranges. When a memory cell is later read back, the Vth is determined to be in one of the ranges of Vth values and a corresponding data value such as one or more bits is assigned.

Waveform 1016 represents the Vth of an unselected memory cell having the same data state as the selected memory cell whose Vth is represented by the waveform 1014. The Vth of the unselected memory cell is kept constant during the erase operation.

Figure 5E:
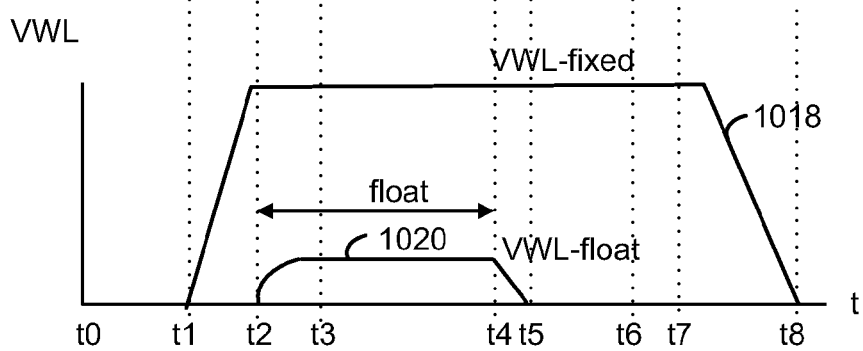
FIG. 5E depicts one embodiment of applied and capacitively coupled voltages for word line layers and word line layer portions during an erase operation.

FIG. 5E depicts one embodiment of applied and capacitively coupled voltages for word line layers and word line layer portions during an erase operation. The voltage of an unselected word line layer or word line layer portion can be fixed at a relatively high level (e.g., VWL-fixed) during the erase operation, as represented by waveform 1018. In contrast, at waveform 1020, the voltage of a selected word line layer or word line layer portion is initially at or close to 0 V (from t0 to t1), and allowed to float higher (e.g., to VWL-float) due to coupling from the column voltage (Vbody), e.g., from t2 to t4. From t4 to t5, VWL is driven lower, e.g., to 0 V, to cause the selected memory cells to be erased. For example, the associated word line driver can set 0 V at t4, where t4 to t5 represents a time for VWL to transition from its current floated level to 0 V. An example amplitude of VWL-fixed is 15-20 V. The dummy word line or word line layer portion can received a fixed non-zero voltage similar to, or lower than VWL-fixed, or floated, for instance.

When VWL is driven lower, there will be a large voltage difference between the control gate (e.g., word line layer or word line layer portion) of a memory cell (VWL), and the body of the memory cell, e.g., in the column (Vbody). This results in a large electric field across the tunnel oxide, which causes Fowler-Nordheim tunneling. In a 3D NAND memory device, during erase, this large electric field mostly causes holes to be injected from the memory cell's body to the charge trapping layer, resulting in a large cell Vth downshift. For unselected word lines, a high voltage is applied instead of 0 V, so that the electric field across the tunnel oxide is much reduced, and no, or very little, hole tunneling will occur. Memory cells of those word lines will not experience much Vth downshift, and as a result, they will not be erased.

In 3D NAND memory, a charge trapping layer instead of floating gate (as in 2D NAND) is used to store electrons/holes, where the Vth level of the charge trapping layer indicates the data state. As a result, the Vth interference between adjacent (same-column) memory cells in an erase operation is typically smaller than in 2D NAND, which can experience large floating gate coupling between adjacent memory cells in an erase operation. Even though the Vth downshift caused by adjacent word lines is relatively smaller in the 3D NAND memory, the interference can still cause a data reliability problem on the unerased word lines. The use of a dummy word line between the erased an unerased word lines resolves this problem.

No significant interference has been observed for same-word line layer, adjacent column memory cells. For example, in FIG. 3A, considering NS0, no significant interference has been observed for the source-side memory cells MC0,1 to MC6,1 in C1 when erasing the drain-side memory cells MC0,0 to MC6,0, respectively, in C0.

In a 3D NAND memory, all the memory cells in one NAND string within a sub-block are divided into two groups by the back gate (BG): cells between SGS and BG, and cells between SGD and BG are located in two columns or pillars which are connected through the BG. If all the word lines between a SG transistor and back-gate transistor are included in one erase group (a group of memory cells being erased in an erase operation), there will be no data word lines bordering this group and therefore no dummy word line is needed. This means the erase operation can be performed for a group which is a strict subset, e.g., half, the normal block size without the need to add dummy word lines. When the erased word line group is smaller, a dummy word line may be used to prevent Vth interference between the groups, as described. When the erase group size is relatively large, still very few dummy word lines are needed, and the penalty in reduced capacity is small. For example, if all the data word lines between a SG transistor and back-gate transistor are divided into two erase groups, then only one dummy WL is needed in the middle between those two groups.

In another sub-block erase method, a high bias (close to the erase voltage) is applied to the SG transistors on a sub-block which is not intended to be erased, to suppress GIDL and hole generation on the drain side of SG transistors, thereby preventing the body potential from charging up. However, there are a few limitations with this method. First, the erased group cannot be smaller than a sub-block, including all the word lines between one pair of SGD/SGS transistors. Second, to avoid polysilicon leakage current induced by a large field along the channel/body direction, several dummy word lines (e.g., three or more) might be needed, reducing the memory bit density.

Figure 6A:
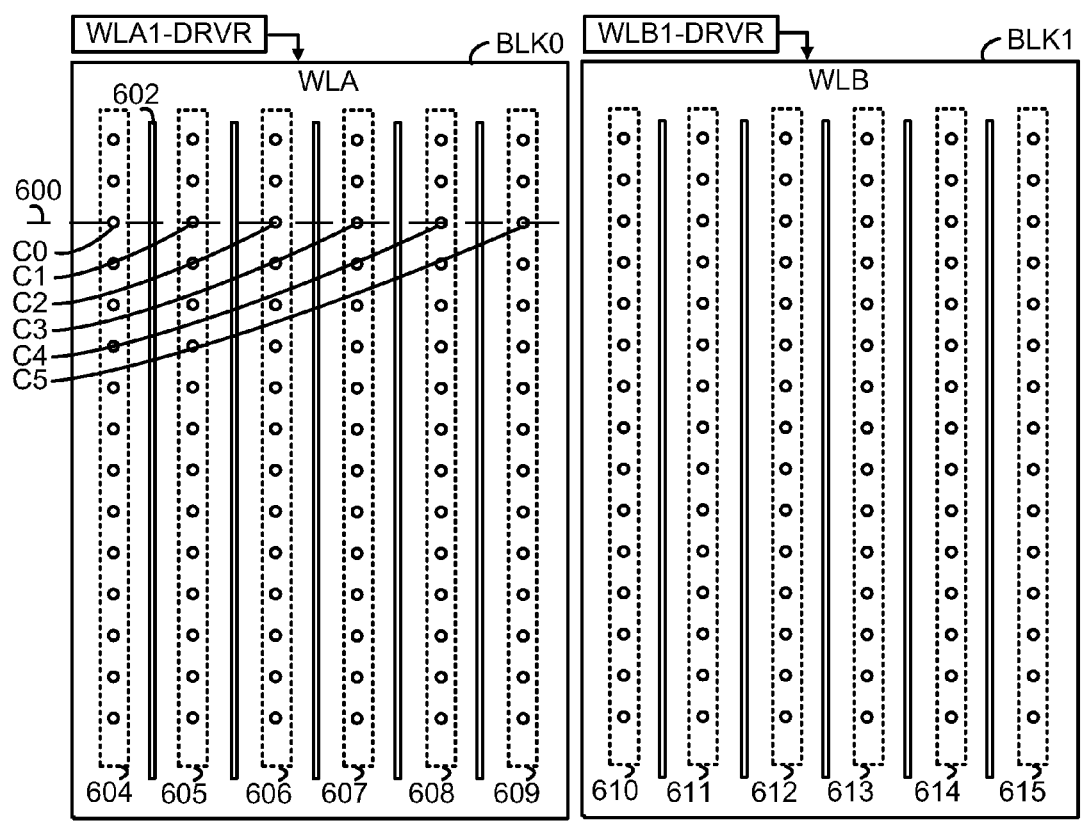
FIG. 6A depicts a top view of word line layers of a 3D non-volatile memory device having straight NAND strings, showing associated drivers.

FIG. 6A depicts a top view of word line layers of a 3D non-volatile memory device having straight NAND strings, showing associated drivers. In this configuration, a NAND string has one column, and the source-side select gate is on the bottom of the column instead of on the top, as in a U-shaped NAND string. Moreover, a given level of a block has one word line layer which is connected to each of the memory cells of the layer. For example, BLK0 has word line layer WLA, driven by WLA1-DRVR, and BLK1 has word line layer WLB, driven by WLB1-DRVR. A number of slits, such as example slit 602, can also be used. These insulation-filled slits are used in the fabrication process to provide structural support for the stack when undoped polysilicon layers are removed by a wet etch and a dielectric is deposited to form the alternating dielectric layers.

A dashed line 600 extends through columns C0 to C6, shown in cross-section in FIG. 6F. Each block can include sub-blocks of columns of memory cells, such as sub-blocks 604 to 609 in BLK0 and sub-blocks 610 to 615 in BLK1.

Figure 6B:
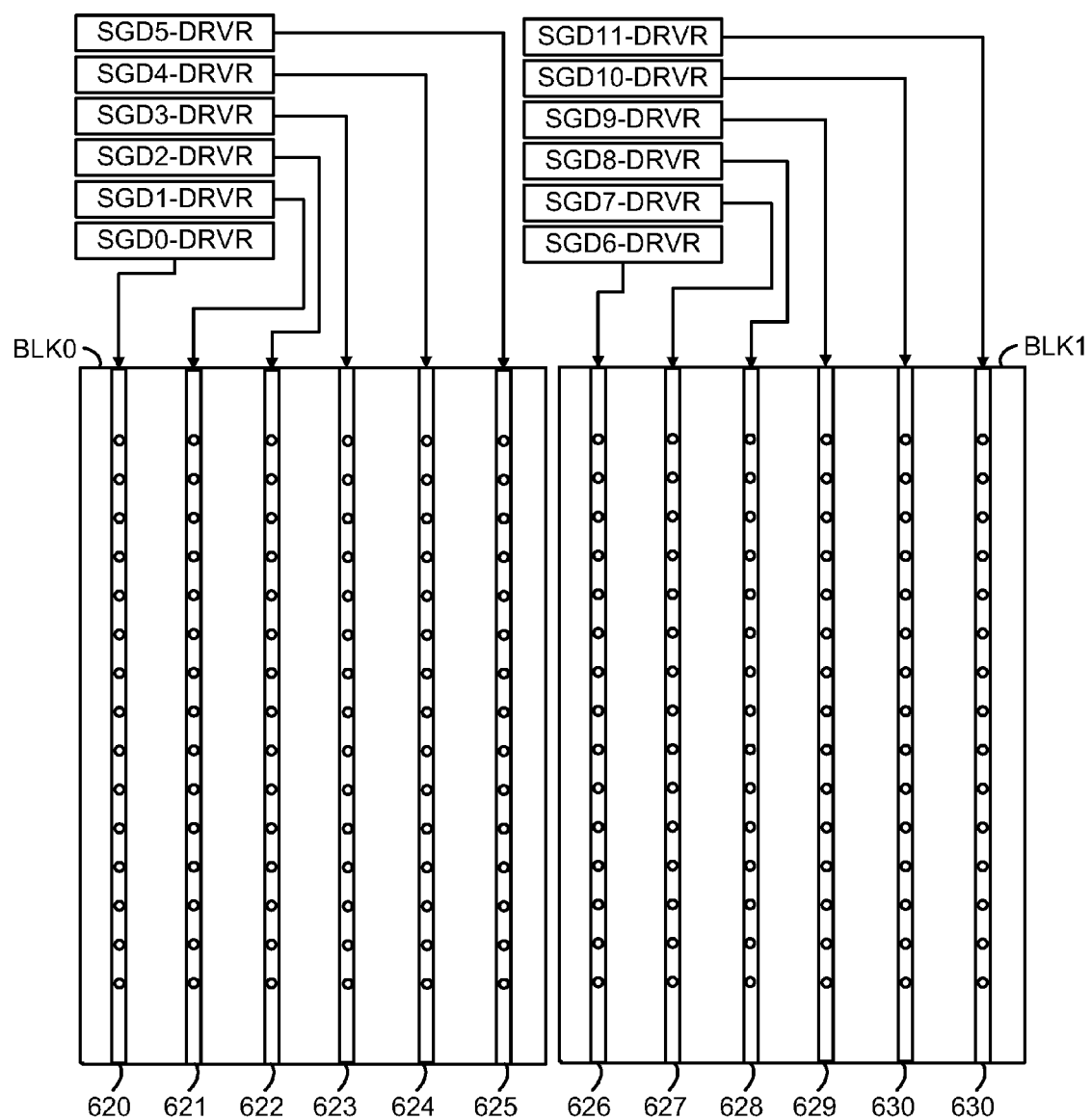
FIG. 6B depicts a top view of a select gate layer of the 3D non-volatile memory device of FIG. 6A, showing drain-side select gate lines and associated drivers.

FIG. 6B depicts a top view of a select gate layer of the 3D non-volatile memory device of FIG. 6A, showing drain-side select gate lines and associated drivers. For example, this can represent layer SGD of FIG. 6F. A separate drain-side select gate line, e.g., a conductive line or path, is associated with each row of columns of memory cells. For example, BLK0 includes select gate lines 620 to 625, which are driven by select gate drivers SGD0-DRVR to SGD5-DRVR, respectively. BLK1 includes select gate lines 626 to 631, which are driven by select gate drivers SGD6-DRVR to SGD11-DRVR, respectively. The select gate drivers provide signals such as voltage waveforms to the select gate lines.

Figure 6C:
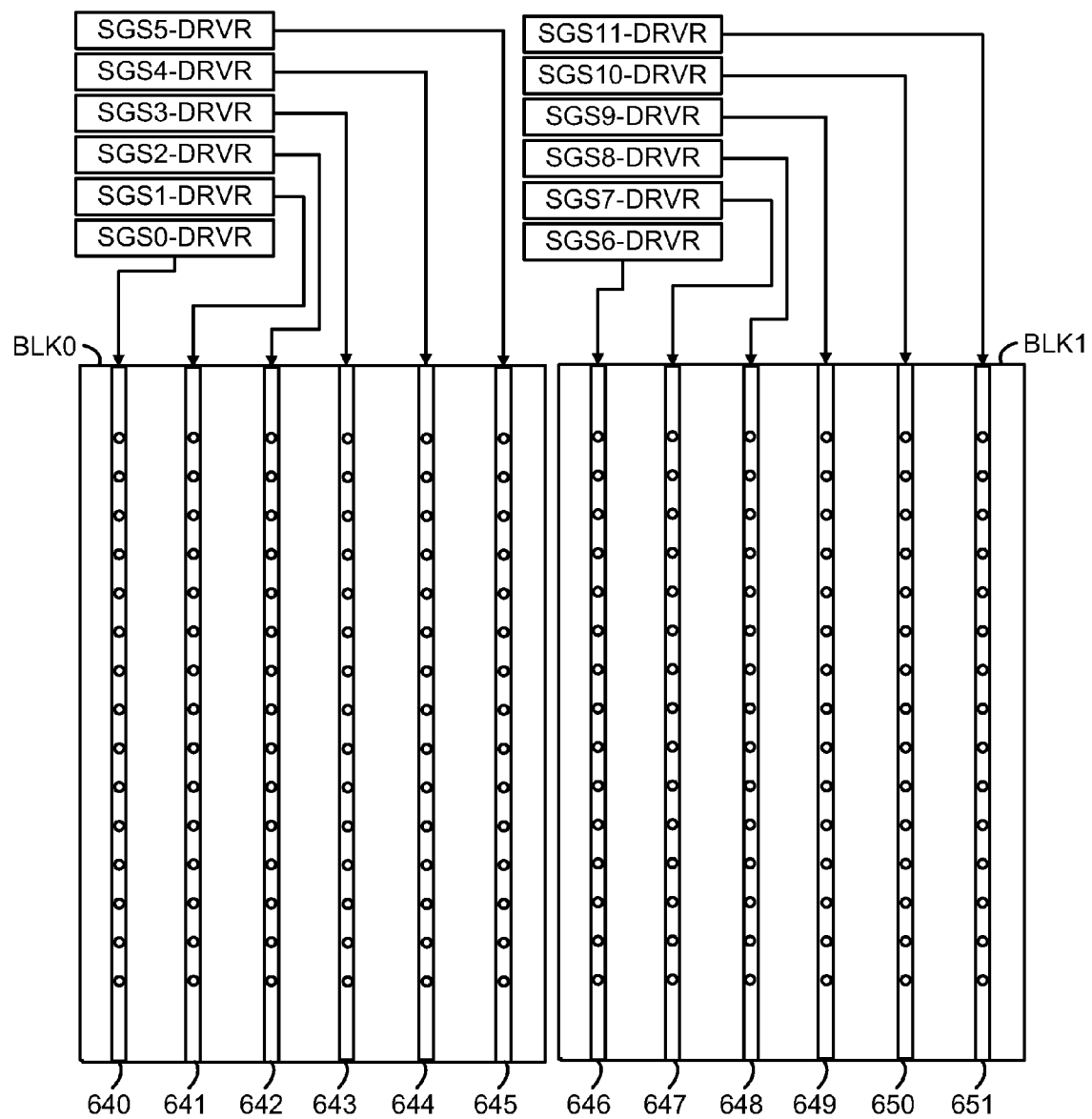
FIG. 6C depicts a top view of a select gate layer of the 3D non-volatile memory device of FIG. 6A, showing source-side select gate lines and associated drivers.

FIG. 6C depicts a top view of a select gate layer of the 3D non-volatile memory device of FIG. 6A, showing source-side select gate lines and associated drivers. For example, this can represent layer SGS of FIG. 6F. A separate source-side select gate line, e.g., a conductive line or path, is associated with each row of columns of memory cells. For example, BLK0 includes select gate lines 640 to 646, which are driven by select gate drivers SGS0-DRVR to SGS5-DRVR, respectively. BLK1 includes select gate lines 646 to 651, which are driven by select gate drivers SGS6-DRVR to SGS11-DRVR, respectively. The select gate drivers provide signals such as voltage waveforms to the select gate lines.

Figure 6D:
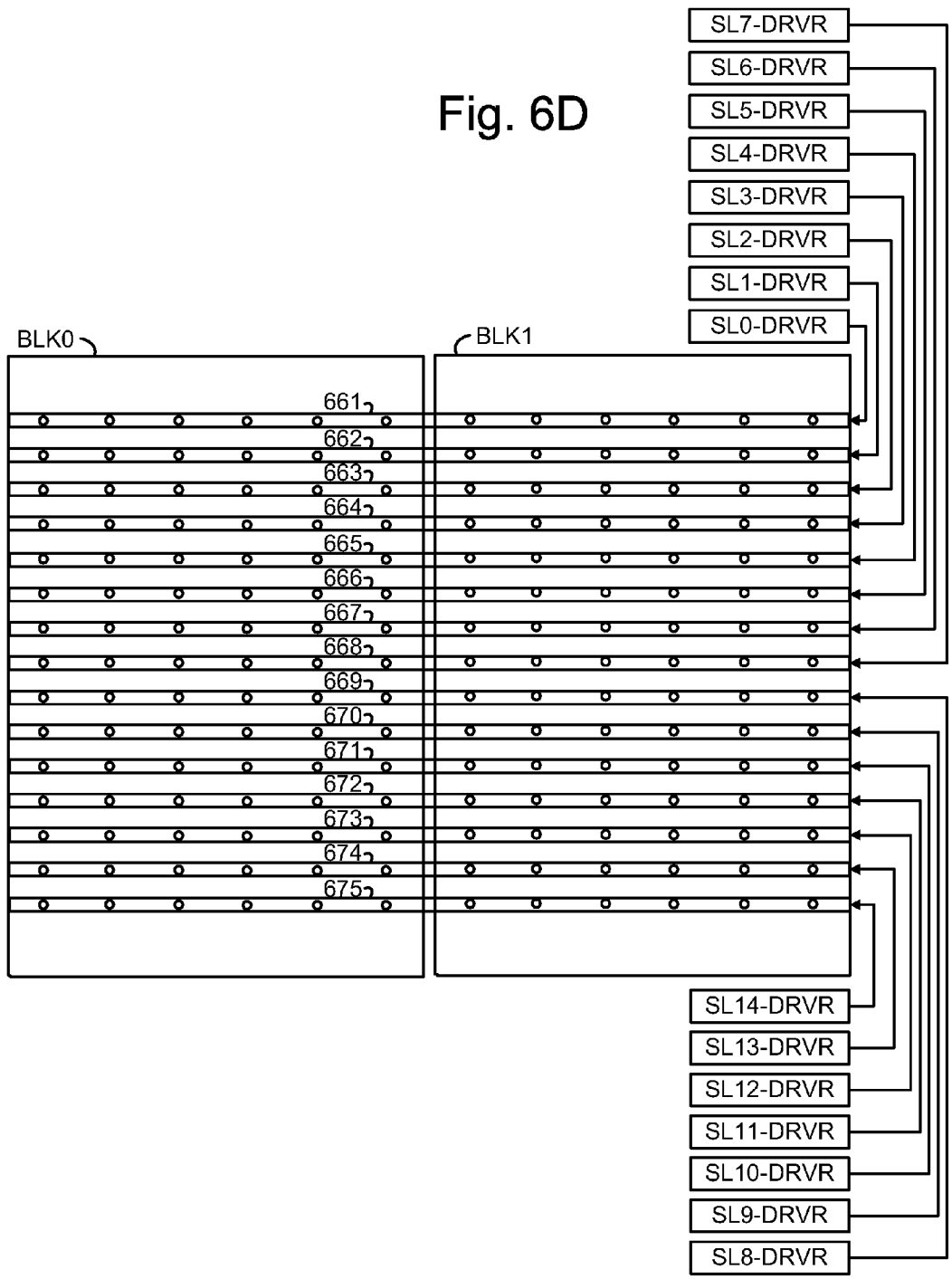
FIG. 6D depicts a top view of a source line layer of the 3D non-volatile memory device of FIG. 6A, showing source lines and associated drivers.

FIG. 6D depicts a top view of a source line layer of the 3D non-volatile memory device of FIG. 6A, showing source lines and associated drivers. For example, this can represent layer SL of FIG. 6F. A source line, e.g., a conductive line or path, is associated with a set of columns of memory cells which extend in a horizontal line in the figure. A source line extends across multiple blocks which are adjacent laterally of one another. A source line is connected to a source-side end of a NAND string, e.g., to a vertical channel or body of the NAND string. For example, source lines 661 to 675 are driven by source line drivers SL0-DRVR to SL14-DRVR, respectively. The source line drivers provide signals such as voltage waveforms to the source-side ends of the NAND strings.

FIG. 6E depicts a top view of a bit line layer of the 3D non-volatile memory device of FIG. 6A, showing bit lines and associated drivers. For example, this can represent layer BL of FIG. 6F. A bit line, e.g., a conductive line or path, is associated with a set of columns of memory cells which extend in a horizontal line in the figure. A bit line extends across multiple blocks which are adjacent laterally of one another. A bit line is connected to a drain-side end of a NAND string, e.g., to a vertical channel or body of the NAND string. For example, bit lines 681 to 695 are driven by bit line drivers BL0-DRVR to BL14-DRVR, respectively. The bit line drivers provide signals such as voltage waveforms to the drain-side ends of the NAND strings.

FIG. 6F depicts a cross-sectional view of a block of the 3D non-volatile memory device of FIG. 6A, along line 600 of FIG. 6A. Columns of memory cells C0 to C5, corresponding to NAND strings NS0 to NS5, respectively, are depicted in the multi-layer stack. The stack 677 includes a substrate 101, an insulating film 109 on the substrate, and a portion of a select line 663. Recall that the additional straight NAND strings in a sub-block extend in front of and in back of the NAND strings depicted in the cross-section, e.g., along the x-axis. The NAND strings NS0 to NS5 are each in a different sub-block. The slit 602 from FIG. 6A is also depicted with other slits. A portion of the bit line 683 is also depicted. Dashed lines depict memory cells and select gates, as discussed further below.

Figure 7A:
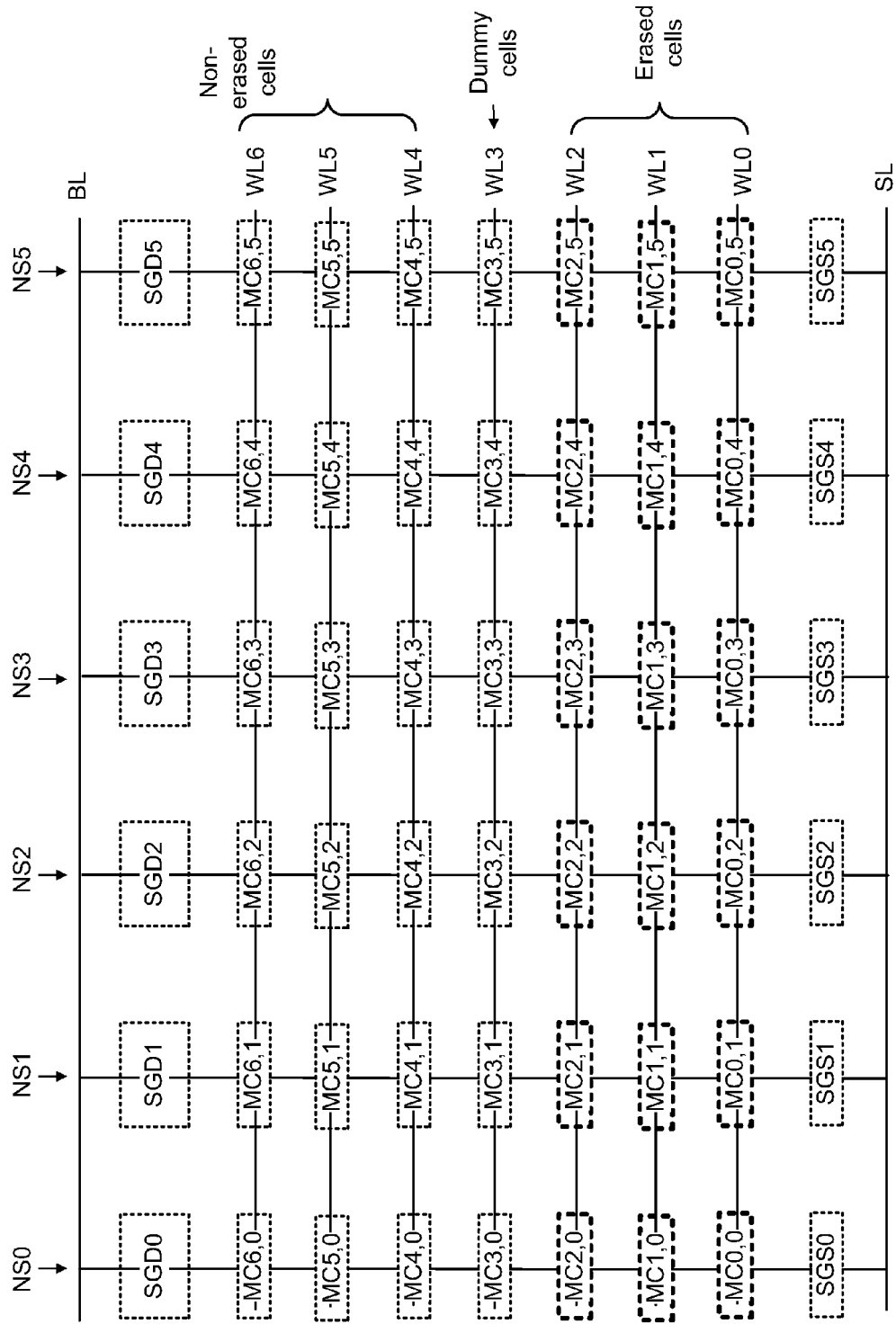
FIG. 7A depicts one embodiment of a process for selectively erasing the memory cells of FIG. 6F, in which memory cells in a subset of word line layers are erased, and dummy cells are between the erased memory cells and non-erased memory cells.

FIG. 7A depicts one embodiment of a process for selectively erasing the memory cells of FIG. 6F, in which memory cells in a subset of word line layers are erased, and dummy cells are between the erased memory cells and non-erased memory cells. NAND strings NS0 to NS5 are depicted. A similar notation as used above is provided. In this erase process, all of the memory cells of WL0 to WL2 are erased, namely MC0,0 to MC0,5 in WL0, MC1,0 to MC1,5 in WL1 and MC2,0 to MC2,5 in WL2. Dummy memory cells MC3,0 to MC3,5 at WL3 are provided. Non-erased memory cells are provided at WL4 to WL6. This approach erases 3/7 of a block, and the dummy memory cells prevent or reduce interference to the memory cells of WL4 due to the reduction in Vth of the memory cells of WL2 in the erase operation.

In this example, circuitry in communication with the stacked non-volatile memory cell array, to perform an erase operation: identifies selected columns of memory cells (e.g., NS0 to NS5, or C0 to C5), and in connection with the erase operation, provides an erase voltage (Verase) to an end of each selected column of memory cells, and, with the erase voltage provided, allows a voltage (Vwl-float) of at least one of the word line layers (e.g., WL0 to WL2) to float, and provides a fixed voltage (Vwl-fixed) to at least another of the word line layers (e.g., WL4 to WL6). A word line layer (e.g., WL3) associated with dummy memory cells (e.g., MC3,0 to MC3,5) which are ineligible to store user data is between the at least one of the word line layers and the at least another of the word line layers. The circuitry lowers the voltage of the at least one of the word line layers, and continues to provide the fixed voltage to the at least another of the word line layers.

Figure 7B:
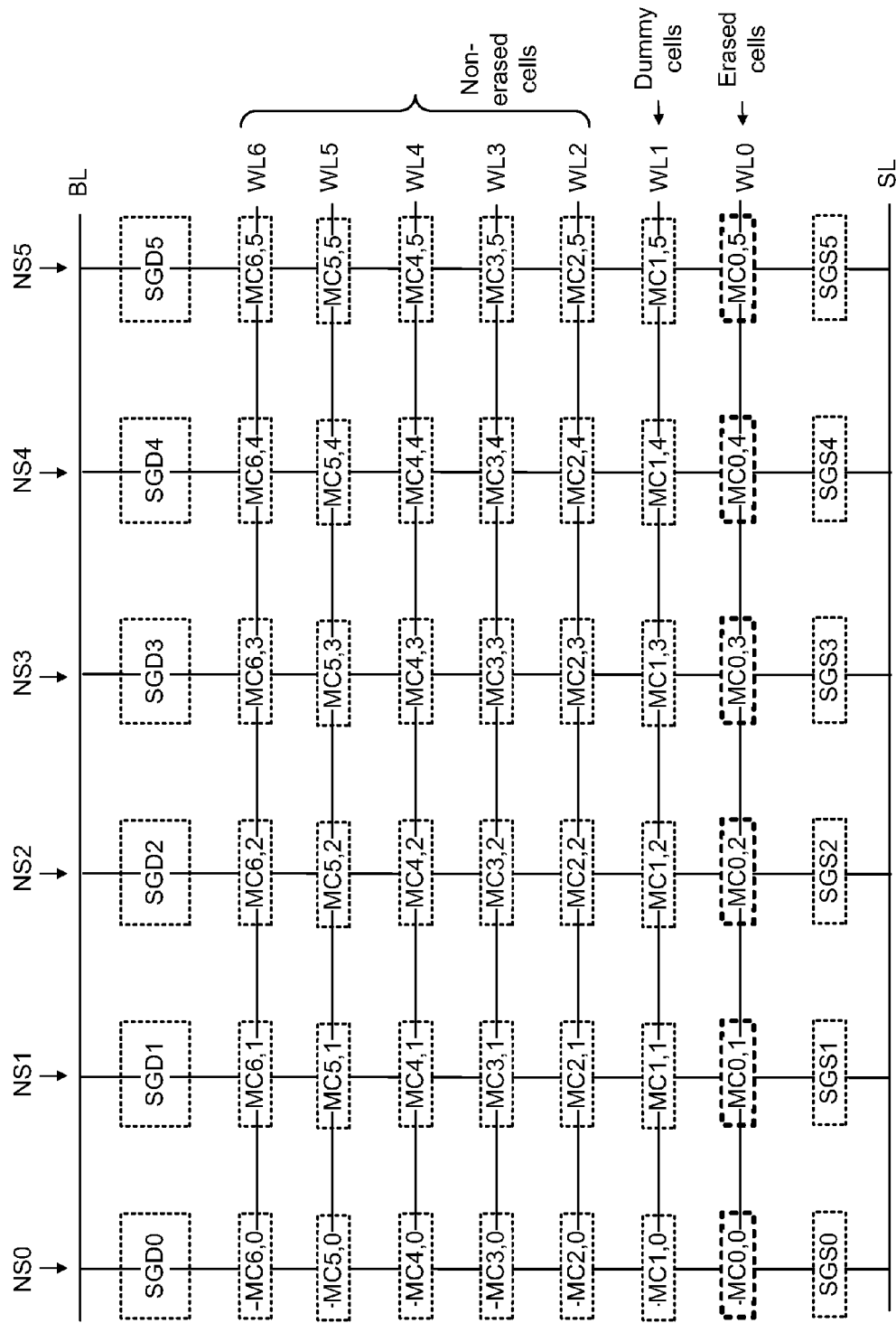
FIG. 7B depicts one embodiment of a process for selectively erasing the memory cells of FIG. 6F, in which memory cells in one end word line layer are erased, and dummy cells are between the erased memory cells and non-erased memory cells.

FIG. 7B depicts one embodiment of a process for selectively erasing the memory cells of FIG. 6F, in which memory cells in one end word line layer are erased, and dummy cells are between the erased memory cells and non-erased memory cells. The erased memory cells are at an end word line layer, e.g., at WL0, a bottommost word line layer of the stack. WL1 is a dummy word line layer with dummy memory cells and WL2 to WL6 are non-erased word line layer with their unselected memory cells. In this approach, 1/7 of a block is erased. In an alternative example, the erased memory cells are at the topmost word line layer (WL6), WL5 is a dummy word line layer and WL0 to WL4 are non-erased word line layers. The dummy memory cells prevent or reduce interference to the memory cells of WL2 due to the reduction in Vth of the memory cells of WL0 in the erase operation.

FIG. 7C depicts one embodiment of a process for selectively erasing the memory cells of FIG. 6F, in which memory cells in one word line layers are erased, and dummy cells are between the erased memory cells and non-erased memory cells, both above and below the erased memory cells. The erased memory cells are at an intermediate word line layer, e.g., at WL3, between non-erased cells at WL5 and WL6, and at WL0 and WL1. A dummy word line layer WL4 is between WL3 and WL5/WL6, and another dummy word line layer WL2 is between WL3 and WL0/WL1. In this approach, 1/7 of a block is erased. The dummy memory cells of WL4 prevent or reduce interference to the memory cells of WL5 due to the reduction in Vth of the memory cells of WL3 in the erase operation. Similarly, the dummy memory cells of WL2 prevent or reduce interference to the memory cells of WL1 due to the reduction in Vth of the memory cells of WL3 in the erase operation.

In this example, the word line layers include first (WL0 and WL1) and second (WL3) sets of one or more word line layers separated by one dummy word line layer (WL2), and the second and a third (WL5 and WL6) set of one or more word line layers separated by another dummy word line layer (WL4). The dummy word line layers are associated with dummy memory cells which are ineligible to store user data. Also, circuitry, in connection with the erase operation, provides an erase voltage (Verase) to an end of each selected column of memory cells, and, with the erase voltage provided, allows a voltage (Vwl-float) of at least one of the word line layers (WL3) to float, provides a fixed voltage (Vwl-fixed) to at least another of the word line layers (WL0 or WL1; WL5 or WL6), and lowers the voltage of the at least one of the word line layers, and continues to provide the fixed voltage to the at least another of the word line layers. The circuitry, in connection with the erase operation, provides a fixed voltage to at least an additional word line layer (WL0 or WL1) of the word line layers. The at least an additional word line layer is in the first set of one or more word line layers, the at least one of the word line layers is in the second set of one or more word line layers, and the at least another of the word line layers is in the third set of one or more word line layers.

FIG. 7D depicts one embodiment of a process for selectively erasing the memory cells of FIG. 6F, in which memory cells in first and second subsets of word line layers are erased, and dummy cells are between the erased memory cells and non-erased memory cells, both above and below the non-erased memory cells. The non-erased memory cells are at an intermediate word line layer, e.g., at WL3, between erased cells at WL5 and WL6, and at WL0 and WL1. A dummy word line layer WL4 is between WL3 and WL5/WL6, and another dummy word line layer WL2 is between WL3 and WL0/WL1. In this approach, 4/7 of a block is erased. The dummy memory cells of WL4 prevent or reduce interference to the memory cells of WL3 due to the reduction in Vth of the memory cells of WL5 in the erase operation. Similarly, the dummy memory cells of WL2 prevent or reduce interference to the memory cells of WL3 due to the reduction in Vth of the memory cells of WL1 in the erase operation.

In this example, the word line layers include first (WL0 and WL1) and second (WL3) sets of one or more word line layers separated by one dummy word line layer (WL2), and the second and a third (WL5 and WL6) set of one or more word line layers separated by another dummy word line layer (WL4). The dummy word line layers are associated with dummy memory cells which are ineligible to store user data. Also, circuitry, in connection with the erase operation, provides an erase voltage (Verase) to an end of each selected column of memory cells, and, with the erase voltage provided, allows a voltage (Vwl-float) of at least one of the word line layers (WL0 or WL1; WL5 or WL6) to float, provides a fixed voltage (Vwl-fixed) to at least another of the word line layers (WL3), and lowers the voltage of the at least one of the word line layers, and continues to provide the fixed voltage to the at least another of the word line layers.

The circuitry, in connection with the erase operation, allows a voltage of at least an additional word line layer (WL0 or WL1) of the word line layers to float, and lowers the voltage of the at least an additional word line layer. The at least one of the word line layers is in the first set of one or more word line layers, the at least another of the word line layers is in the second set of one or more word line layers, and the at least an additional word line layer is in the third set of one or more word line layers.

Accordingly, it can be seen that, in one embodiment, a 3D stacked non-volatile memory device includes: a substrate; a stacked non-volatile memory cell array carried by the substrate, the stacked non-volatile memory cell array comprising: (a) a plurality of U-shaped NAND strings, each U-shaped NAND string comprising, connected by a back gate, a selected column of memory cells and an unselected column of memory cells, and (b) word line layers alternating with dielectric layers, each word line layer comprising a selected word line layer portion in communication with memory cells in the selected columns of memory cells, but not with memory cells in the unselected columns of memory cells, and an unselected word line layer portion in communication with the memory cells in the unselected columns of memory cells, but not with the memory cells in the selected columns of memory cells; and circuitry in communication with the stacked non-volatile memory cell array, the circuitry provides voltages to the selected word line layer portions and to an end of each selected column of memory cells, to perform an erase operation which erases at least one memory cell in each selected column of memory cells, and provides voltages to the unselected word line layer portions and an end of each unselected column of memory cells, to not erase any memory cells in each unselected column of memory cells during the erase operation.

A corresponding method embodiment provides a method for performing an erase operation in a 3D stacked non-volatile memory device. The method includes: identifying selected and unselected columns of memory cells of U-shaped NAND strings in a stacked non-volatile memory cell array, in connection with an erase operation, the stacked non-volatile memory cell array comprising word line layers alternating with dielectric layers, each word line layer comprising a selected word line layer portion in communication with memory cells in the selected columns of memory cells, but not with memory cells in the unselected columns of memory cells, and an unselected word line layer portion in communication with memory cells in the unselected columns of memory cells, but not with memory cells in the selected columns of memory cells; and while providing an erase voltage (Verase) to an end of each selected column of memory cells: allowing a voltage (Vwl-float) of at least one of the selected word line layer portions, to float, while providing a fixed voltage (Vwl-fixed) for each of the unselected word line layer portions, and subsequently, lowering the voltage of the at least one of the selected word line layer portions.

Another embodiment provides a 3D stacked non-volatile memory device, comprising: a substrate; a stacked non-volatile memory cell array carried by the substrate, the stacked non-volatile memory cell array comprising: (a) a plurality of NAND strings, each NAND string comprising at least one column of memory cells and (b) word line layers alternating with dielectric layers, including first and second sets of one or more word line layers separated by one dummy word line layer, and the second and a third set of one or more word line layers separated by another dummy word line layer; and circuitry in communication with the stacked non-volatile memory cell array, the circuitry, to perform an erase operation: (c) identifies selected columns of the columns of memory cells, and (d) in connection with the erase operation, provides an erase voltage (Verase) to an end of each selected column of memory cells, and, with the erase voltage provided, allows a voltage (Vwl-float) of at least one of the word line layers to float, provides a fixed voltage (Vwl-fixed) to at least another of the word line layers, and lowers the voltage of the at least one of the word line layers, and continues to provide the fixed voltage to the at least another of the word line layers.

A corresponding method for performing an erase operation in a 3D stacked non-volatile memory device, includes: identifying selected columns of memory cells of NAND strings, in a stacked non-volatile memory cell array, the stacked non-volatile memory cell array comprising word line layers alternating with dielectric layers, including first and second sets of one or more word line layers separated by one dummy word line layer, and the second and a third set of one or more word line layers separated by another dummy word line layer; identifying at least one selected word line layer among the word line layers alternating with the dielectric layers; while providing an erase voltage to an end of each selected column of memory cells: allowing a voltage of the at least one selected word line layer to float, providing a fixed voltage to at least another of the word line layers, and lowering the voltage of the at least one selected word lines.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for performing an erase operation in a 3D stacked non-volatile memory device, comprising:
   identifying selected and unselected columns of memory cells of U-shaped NAND strings in a stacked non-volatile memory cell array, in connection with an erase operation, the stacked non-volatile memory cell array comprising: (a) word line layers alternating with dielectric layers, each word line layer comprising a selected word line layer portion in communication with memory cells in the selected columns of memory cells, but not with memory cells in the unselected columns of memory cells, (b) an unselected word line layer portion in communication with memory cells in the unselected columns of memory cells, but not with memory cells in the selected columns of memory cells, (c) select gates for the selected columns and (d) select gates for the unselected columns; and
   while providing a voltage to the selected word line layer portions, a voltage to an end of each selected column of memory cells, a voltage to each of the select gates for the selected columns, and a voltage to each of the select gates for the unselected columns: erasing the selected columns by allowing a voltage of at least one of the selected word line layer portions to float, while providing a fixed voltage for each of the unselected word line layer portions to not erase the unselected columns, and subsequently, lowering the voltage of the at least one of the selected word line layer portions while maintaining the fixed voltage for each the unselected word line layer portions, wherein
   the voltage applied to the select gates for the selected columns and the voltage applied to the end of each selected column place the select gates for the selected columns in a conductive state, and the voltage applied to the select gates for the unselected columns and the voltage applied to the end of each unselected column place the select gates for the unselected columns in a non-conductive state.

2. The method of claim 1, wherein:
   the at least one of the selected word line layer portions comprises each of the selected word line layer portions.

3. The method of claim 1, further comprising, during the providing the erase voltage and the allowing the voltage of the at least one of the selected word line layer portions to float:
   setting a fixed voltage for at least another of the selected word line layer portions, a word line layer portion associated with dummy memory cells which are ineligible to store user data is between the at least one of the selected word line layer portions and the at least another of the selected word line layer portions.

4. The method of claim 1, wherein:
   the at least one of the selected word line layer portions comprises at least one selected word line layer portion above one word line layer portion associated with dummy memory cells which are ineligible to store user data, and at least one selected word line layer portion below another word line layer portion associated with dummy memory cells which are ineligible to store user data; and
   the method further comprises, during the providing the erase voltage and the allowing the voltage of the at least one of the selected word line layer portions of memory cells to float, setting a fixed voltage for at least another of the selected word line layer portions, which is between the one and the another word line layer portions.

5. The method of claim 1, wherein:
   the at least one of the selected word line layer portions is between one word line layer portion associated with dummy memory cells which are ineligible to store user data, and another word line layer portion associated with dummy memory cells which are ineligible to store user data; and
   the method further comprises, during the providing the erase voltage and the allowing the voltage of at least one of the selected word line layer portions of memory cells to float, setting a fixed voltage for: at least one of the selected word line layer portions which is above the one word line layer portion, and at least one of the selected word line layer portions which is below the another word line layer portion.

6. The method of claim 1, wherein, for each of the U-shaped NAND strings:
   the selected column of memory cells is at a drain side of the U-shaped NAND string; and
   the unselected column of memory cells is at a source side of the U-shaped NAND string.

7. The method of claim 1, wherein, for each of the U-shaped NAND strings:
   the unselected column of memory cells is at a drain side of the U-shaped NAND string; and
   the selected column of memory cells is at a source side of the U-shaped NAND string.

8. The method of claim 1, further comprising:
   generating a gate-induced drain leakage (GIDL) current in each selected column by applying the voltage to the select gates for the selected columns and applying the voltage to the end of each selected column allow the select gates for the selected columns; and
   preventing the select gates for the unselected columns from generating a gate-induced drain leakage (GIDL) current in each unselected column by applying the voltage to the select gates for the unselected columns and applying the voltage to the end of each unselected column.

9. The method of claim 1, wherein:
the voltage applied to the select gates for the selected columns is a positive voltage; and
the voltage applied to the select gates for the unselected columns is ground voltage.

10. The method of claim 1, wherein:
the selected and unselected columns of memory cells are formed above the substrate in one or more physical levels of memory cells in a three-dimensional non-volatile memory.

11. The method of claim 1, wherein:
the selected and unselected columns of memory cells comprise active areas which are formed above the substrate in one or more physical levels of memory cells in a three-dimensional non-volatile memory, the active areas comprise channels of the selected and unselected columns of memory cells.

12. A method for performing an erase operation in a 3D stacked non-volatile memory device, comprising:
identifying selected columns of memory cells of NAND strings, in a stacked non-volatile memory cell array, the stacked non-volatile memory cell array comprising word line layers alternating with dielectric layers, including first and second sets of one or more word line layers separated by one dummy word line layer, and the second and a third set of one or more word line layers separated by another dummy word line layer;
identifying at least one selected word line layer among the word line layers alternating with the dielectric layers, each word line layer comprising a selected word line layer portion in communication with memory cells in the selected columns of memory cells; and
while providing a voltage to the at least one selected word line layer portions, a voltage to an end of each selected column of memory cells, a voltage to each of gates corresponding to the selected columns, and a voltage to each of gates corresponding to unselected columns: allowing a voltage of the at least one selected word line layer to float, providing a fixed voltage to at least another of the word line layers, lowering the voltage of the at least one selected word lines, and erasing the selected column of memory cells in one of the first and second sets of one or more word line layers and not erasing the selected column of memory cells in the other of the first and second sets of the one or more word line layers.

13. The method of claim 12, wherein, while providing the erase voltage to the end of each selected column of memory cells: erasing the selected column of memory cells in one of the second and third sets of one or more word line layers and not erasing the selected column of memory cells in the other of the second and third sets of one or more word line layers.

14. The method of claim 12, wherein, in each selected column of memory cells: the at least one memory cell which is erased comprises at least one memory cell which is eligible to store user data and which is above the dummy memory cells, and at least one memory cell which is eligible to store user data and which is below the another dummy memory cells, the dummy memory cells and the another dummy memory cells are ineligible to store user data.

15. The method of claim 12, wherein, in each selected column of memory cells: the at least one memory cell which is not erased comprises the at least one memory cell which is eligible to store user data and which is above the dummy memory cells, and at least one memory cell which is eligible to store user data and which is below the another dummy memory cells, the dummy memory cells and the another dummy memory cells are ineligible to store user data.

16. The method of claim 12, wherein, for each of the NAND strings:
the selected column of memory cells of the first set is at a drain side of the NAND string; and
the selected column of memory cells of the second set is at a source side of the NAND string.

17. The method of claim 12, wherein, for each of the NAND strings:
the selected column of memory cells of the second set is at a drain side of the NAND string; and
the selected column of memory cells of the first set is at a source side of the NAND string.

18. The method of claim 12, wherein, for each of the NAND strings:
the selected column of memory cells of the second set is at a drain side of the NAND string; and
the selected column of memory cells of the third set is at a source side of the NAND string.

19. The method of claim 12, wherein, for each of the NAND strings:
the selected column of memory cells of the third set is at a drain side of the NAND string; and
the selected column of memory cells of the second set is at a source side of the NAND string.

20. A method for performing an erase operation in a 3D stacked non-volatile memory device, comprising:
identifying selected columns of memory cells of NAND strings, in a stacked non-volatile memory cell array, the stacked non-volatile memory cell array comprising word line layers alternating with dielectric layers, including first and second sets of one or more word line layers separated by one dummy word line layer, and the second and a third set of one or more word line layers separated by another dummy word line layer;
identifying at least one selected word line layer among the word line layers alternating with the dielectric layers; and
while providing an erase voltage to an end of each selected column of memory cells: allowing a voltage of the at least one selected word line layer to float, providing a fixed voltage to at least another of the word line layers, and lowering the voltage of the at least one selected word lines, wherein
in each selected column of memory cells:
at least one memory cell which is not erased during the erase operation is above the at least one memory cell which is erased;
at least one memory cell which is not erased during the erase operation is below the at least one memory cell which is erased;
a dummy memory cell which is ineligible to store user data is between: (v) the at least one memory cell which is not erased during the erase operation and which is above the at least one memory cell which is erased and (vi) the at least one memory cell which is erased; and
a dummy memory cell which is ineligible to store user data is between: (vii) the at least one memory cell which is not erased during the erase operation and which is below the at least one memory cell which is erased and (viii) the at least one memory cell which is erased.

* * * * *